United States Patent
Dervishi et al.

(10) Patent No.: US 11,471,838 B1
(45) Date of Patent: Oct. 18, 2022

(54) GRAPHENE MEMBRANE MICROFLUIDIC SYSTEM

(71) Applicant: Triad National Security, LLC, Los Alamos, NM (US)

(72) Inventors: Enkeleda Dervishi, Los Alamos, NM (US); Justin R. Marquez, Los Alamos, NM (US); Quinn McCulloch, Los Alamos, NM (US); Stephen L. Yarbro, Los Alamos, NM (US); Eric L. Auchter, Los Alamos, NM (US)

(73) Assignee: Triad National Security, LLC, Los Alamos, NM (US)

( * ) Notice: Subject to any disclaimer, the term of this patent is extended or adjusted under 35 U.S.C. 154(b) by 428 days.

(21) Appl. No.: 16/531,600

(22) Filed: Aug. 5, 2019

Related U.S. Application Data

(60) Provisional application No. 62/715,172, filed on Aug. 6, 2018.

(51) Int. Cl.
*B01D 69/12* (2006.01)
*B01D 71/02* (2006.01)
*B01D 63/00* (2006.01)
*B81B 3/00* (2006.01)

(52) U.S. Cl.
CPC ............ *B01D 69/12* (2013.01); *B01D 63/00* (2013.01); *B01D 71/021* (2013.01); *B81B 3/0089* (2013.01); *B01D 2313/20* (2013.01); *B01D 2325/028* (2013.01)

(58) Field of Classification Search
CPC ...... B01D 69/12; B01D 71/021; B01D 63/00; B01D 2313/20; B01D 2325/028; B81B 3/0089
See application file for complete search history.

(56) References Cited

U.S. PATENT DOCUMENTS

| | | | |
|---|---|---|---|
| 10,003,149 B2* | 6/2018 | Beroz | H01H 35/26 |
| 10,128,601 B1* | 11/2018 | Beroz | H01R 13/2428 |
| 2018/0048084 A1* | 2/2018 | Beroz | G01R 31/2884 |

OTHER PUBLICATIONS

Auchter, E. et al.; "A facile alternative technique for large-area graphene transfer via sacrificial polymer"; 2017; AIP Adv. 7 125306.
Auchter, E. et al.; "Ultra-thin and strong formvar-based membranes with controlled porosity for micro- and nano-scale systems"; 2018; Nanotechnology 29; 215712.

(Continued)

*Primary Examiner* — Waqaas Ali
(74) *Attorney, Agent, or Firm* — Klarquist Sparkman, LLP

(57) ABSTRACT

A microfluidic assembly can include a first microchannel substrate defining one or more first microchannels, a second microchannel substrate defining one or more second microchannels. The assembly can further include a membrane positioned between the first and second microchannel substrates and comprising a first polymeric layer, a second polymeric layer, and one or more graphene layers disposed between the first and second polymeric layers. At least a portion of the first microchannels can overlap at least a portion of the second microchannels such that, when a first fluid is present in the first microchannels and a second fluid is present in the second microchannels, the first fluid and the second fluid contact opposite sides of the membrane.

20 Claims, 19 Drawing Sheets

(56) References Cited

OTHER PUBLICATIONS

Callinan, T. D.; "The thermal evaluation of formvar resin"; 1951; J. Electrochem. Soc. 98 171.

Chowdhury, A. et al.; "Development of free-standing submicron formvar films with multiple thickness steps for XUV-soft x-ray applications"; 1999; Sadhana vol. 24; pp. 551-555.

Edwards, C. A. et al.; "A technique for achieving consistent release of formvar film from clean glass slides"; 1984; Journal of Electron Microscopy Technique; 1:203-4.

Farmer, J. et al.; "Assessing porosity of proton exchange membrane fuel cell gas diffusion layers by scanning electron microscope image analysis"; 2012; Journal of Power Sources 197; pp. 1-11.

Ferrari, A. C. et al.; "Raman spectrum of graphene and graphene layers"; 2006; Physical Review Letters 97; 187401.

Jiao, F. et al.; "Self-repair and patterning of 2D membranelike peptoid materials"; 2016; Advanced Functional Materials; vol. 26; pp. 8960-8967.

Larramendi, P. C. H. "Simplified and reliable procedure for formvar coating single hole or slotted grids"; 1987; Journal of Electron Microscopy Technique; 5: 383-384.

Li, C. et al.; "Effects of graphene membrane parameters on diaphragm-type optical fibre pressure sensing characteristics"; 2015; Materials Research Innovations; vol. 19; S5:17-23.

Mannsfeld, S. C. B. et al.; "Highly sensitive flexible pressure sensors with microstructured rubber dielectric layers"; 2010; Nature Materials; vol. 9; pp. 859-864.

Mark, D. et al.; "Microfluidic lab-on-a-chip platforms: requirements, characteristics and applications"; 2010; Chemical Society Reviews; vol. 39; pp. 1153-1182.

Moharir, A. V. et al.; "Formvar holey films and nets for electronmicroscopy"; 1975; Journal of Physics E: Scientific Instruments; vol. 8; pp. 288-290.

Ochoa, N. A. et al.; "Pore size distributions based on AFM imaging and retention of multidisperse polymer solutes"; 2001; Journal of Membrane Science; 187; pp. 227-237.

Qian, D. et al.; "Effect of interlayer potential on mechanical deformation of multiwalled carbon nanotubes"; 2003; Journal of Nanoscience and Nanotechnology; vol. 3; pp. 185-191.

Shukla, R. P. et al., "Interferometric measurement of thickness of thin films of formvar deposited on glass plates"; 2015; Journal of Optics; vol. 29; pp. 85-93.

Stadermann, M. et al.; "Radiation tolerance of ultra-thin formvar films"; 2012; Applied Physics Letters; 101; 071908; 5 pages.

Tratynek, J. et al.; "Test Methods for Determining the Chemical Waste Compatibility of Synthetic Liners"; 1984; (Cambridge, MA: Arthur D. Little, Inc.); 4 pages.

Xu, B. et al.; "Two-dimensional graphene-like C2N: an experimentally available porous membrane for hydrogen purification"; 2015; Phys. Chem. Chem. Phys. 17 15115-8.

Ebrahim, "Electrical transport mechanism in polyaniline/formvar blend films," High Performance Polymers, 21(4): 468-483, 16 pages, Oct. 13, 2008.

Goodhew P J, Beanland Rand Humphreys F J 2001 *Electron Microscopy and Analysis* 3rd edn (London: Taylor and Francis), 7 pages.

Lee et al., "Formvar assisted graphene transfer for graphene TEM grid," Journal of Nanoscience and Nanotechnology, 16(2): 1810-1813, 4 pages, Feb. 1, 2016.

Ma et al., "High-Sensitivity Fiber-Tip Pressure Sensor with Graphene Diaphragm," Optics Letters, vol. 37, No. 13, pp. 2493-2495, 3 pages, 2012.

Ngene et al., "A microfluidic membrane chip for in situ fouling characterization," Journal of Membrane Science, 346, pp. 202-207, 6 pages, Sep. 23, 2009.

Plompen et al., "Stopping powers of 200-3200 keV $^4$He and 550-1550 keV $_1$H ions in polyimide," Journal of Applied Physics, 80, 3147, 9 pages, Jun. 6, 1996.

Roelofs et al., "Microfluidic desalination techniques and their potential applications," Royal Society of Chemistry, Lab Chip, 15, 3428, 11 pages, Jul. 21, 2015.

Suzuki et al., "Synaptosomal Cytoskeleton Visualized by Whole Mount Electron Microscopy," Neurochem, Int., vol. 6, No. 4, pp. 573-587, 15 pages, 1984.

\* cited by examiner

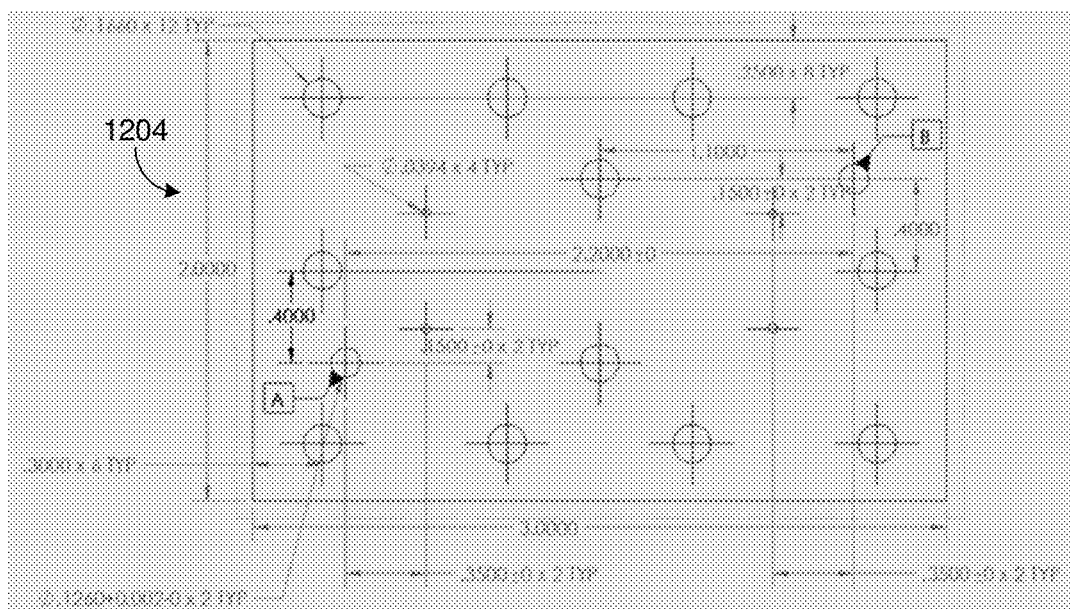
FIG. 14A
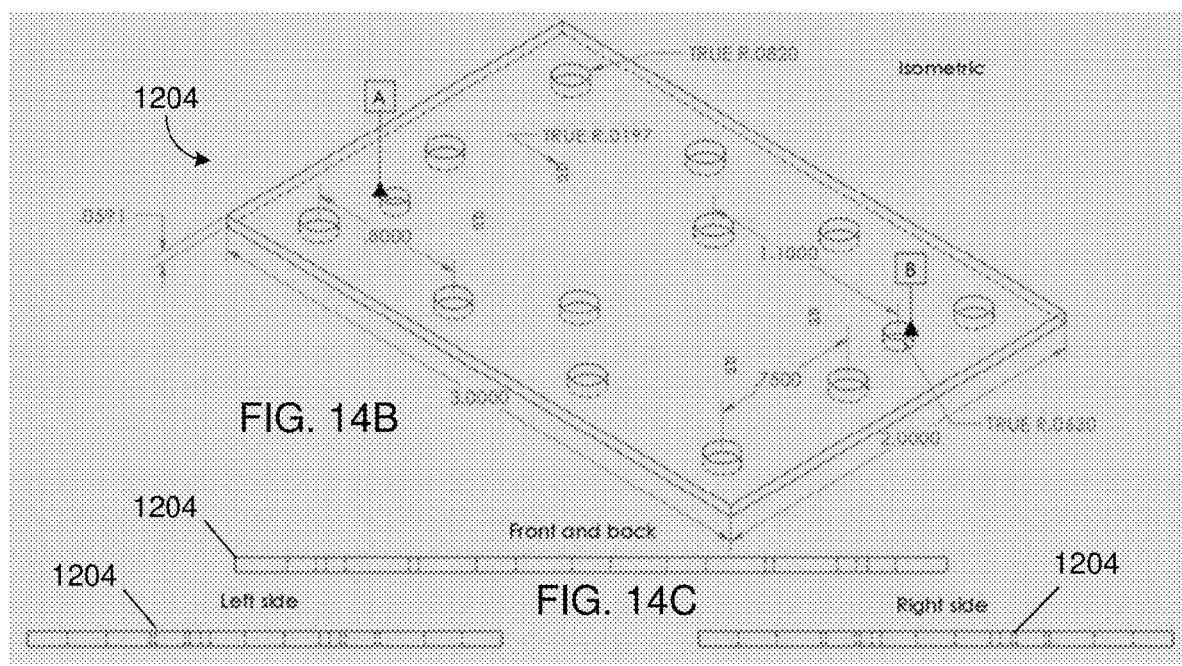
FIG. 14B
FIG. 14C
FIG. 14D FIG. 14E

| Device name | No. of channels | Flow type | Path length (mm) | Max Flow Rates (µL/min) |
|---|---|---|---|---|
| Single-Channel | 1 | Co-current | 2.5 | 25 |
| Single-Channel | 1 | Counter-current | 2.5 | 25 |
| Dolomite with Teflon membrane | 1 | Counter-current | 500 | 1000 |
| Four-Channel | 4 | Counter-current | 5 | 100 |

Scaling estimate

|  | Single chip (rectangular) | Multi chip (rectangular) | Circular Scaled device (cylindrical) |
|---|---|---|---|
| Size (inches) | 3 x 2 x 1 | 3 x 2 x 2 | 6 ⌀ x 4 h |
| Number of channels per chip | 4 | 75 | 1040 |
| Fluid contact length (m) | 0.005 | 0.48 | 10 |
| Diffusion length (microns) | 100 | 100 | 100 |
| Flow rate (mL/min) | 0.01 | 1.875 | 26 |
| Number of quartz chips | 1 | 25 | <85 total layers |

FIG. 30

GRAPHENE MEMBRANE MICROFLUIDIC SYSTEM

CROSS-REFERENCE TO RELATED APPLICATIONS

This application claims the benefit of U.S. Provisional Application No. 62/715,172, filed on Aug. 6, 2018, which is incorporated by reference herein in its entirety.

ACKNOWLEDGMENT OF GOVERNMENT SUPPORT

This invention was made with government support under Contract No. 89233218CNA000001 awarded by the U.S. Department of Energy/National Nuclear Security Administration. The government has certain rights in the invention.

BACKGROUND

Existing micro-scale fluid-fluid contactors and separators typically use a single fluidic channel design, making high throughput microfluidic contactors impractical. Other microfluidic devices that use membranes to separate fluid phases can circumvent this scalability issue by using a membrane sandwiched between two sets of microfluidic channels where the fluids flow on either side of the membrane. In such cases, multiple parallel channels can be implemented. However, some types of membranes can decrease mass transfer between the two fluids because the membrane acts as a barrier. Accordingly, a need exists for improved membranes for microfluidic devices.

SUMMARY

Embodiments of the technology described herein relate to microfluidic devices including channels and membranes for bringing different fluids near enough to one another to effect ion exchange, mass transfer, and/or other interactions without allowing the fluids to directly contact one another or to mix.

Microfluidic assemblies as described herein can be helpful for better filtering products from waste streams in, for example, laboratory environments, and for reclaiming products for purposes of recycling. The membrane system described herein can use nanomaterials in order to sieve and/or remove material from one or more fluid streams. The fluidic assembly can be used to efficiently separate extremely small particles from a fluid, and can be adjusted to select which particles are separated from the fluid flowing through the system. Disclosed embodiments of the assembly can provide the following advantages: (1) the assembly can mitigate the risk of leakage; (2) the assembly can utilize thinner membranes, thus saving space; (3) properties of the membranes can be selected or controlled depending on the desired products to be removed; (4) the assembly can use quartz chips that are reusable and easily made; (5) the membrane system is chemically stable; and (6) the membrane system can be produced in large quantities at a low cost. Furthermore, the passive functioning of the membrane system, combined with the relatively low cost of the materials, allows for a lower economic discard limit (EDL), meaning there will be more recoverable "scrap" and less unrecoverable "waste."

In a representative embodiment, a microfluidic assembly can include a first microchannel substrate, a second microchannel substrate, and a membrane. The first microchannel substrate can define a first microchannel, and the second microchannel substrate can define a second microchannel. The membrane can be positioned between the first and second microchannel substrates and can comprise a first polymeric layer, a second polymeric layer, and at least one graphene layer disposed between the first and second polymeric layers. At least a portion of the first microchannel can overlap at least a portion of the second microchannel such that, when a first fluid is present in the first microchannel and a second fluid is present in the second microchannel, the first fluid and the second fluid contact opposite sides of the membrane.

In some embodiments, the assembly can further comprise a sealing member disposed between the membrane and at least one of the first microchannel substrate and the second microchannel substrate.

In some embodiments, first and second microchannel substrates and the membrane can be situated in a housing.

In a representative embodiment, an assembly can comprise a first microchannel substrate defining a first microchannel, a second microchannel defining a second microchannel, and a membrane disposed between the first and second microchannel substrates. The membrane can comprise a first polymeric layer, a second polymeric layer, and at least one graphene layer disposed between the first and second polymeric layers. At least a portion of the first microchannel overlaps at least a portion of the second microchannel such that, when a first fluid is present in the first microchannel and a second fluid is present in the second microchannel, the first fluid and the second fluid contact opposite sides of the membrane.

In some embodiments, the assembly can further comprise further comprising a sealing member disposed between the membrane and at least one of the first microchannel substrate and the second microchannel substrate.

In some embodiments, the first and second microchannel substrates and the membrane are situated in a housing. In some embodiments, the membrane comprises a plurality of graphene layers between the first and second polymeric layers.

In some embodiments, the functional groups are selected to modify at least one of: a surface area; a reactivity; a hydrophilicity; a surface energy; a magnetic property; a catalytic property; and a conductive property of the at least one graphene layer.

In some embodiments, the at least one graphene layer comprises pores extending through the graphene layer.

In some embodiments, the first and second microchannels each comprise an inlet portion, a main portion, and an outlet portion, and wherein the first and second microchannel substrates are disposed such that the main portions of the first and second microchannels overlap.

In some embodiments, the main portion of each microchannel branches into a plurality of additional microchannels. In some embodiments, the membrane is configured to allow the transfer of particles across the membrane while preventing the first and second fluids from contacting one another.

In some embodiments, the first polymeric layer is permeable at least to the first fluid, the second polymeric layer is permeable at least to the second fluid, and the graphene layer is impermeable to the first fluid and impermeable to the second fluid. In some embodiments, the first polymeric layer and the second polymeric layer comprise pores to allow fluid to flow through the first polymeric layer and the second polymeric layer and contact the graphene layer.

In some embodiments, the second microchannel is defined in a first surface of the second substrate, and wherein the second substrate defines a third microchannel in a second surface. In some embodiments, the assembly further comprises a third microchannel substrate defining a fourth microchannel, and a second membrane disposed between the second surface of the second microchannel substrate and the third microchannel substrate; wherein at least a portion of the third microchannel overlaps at least a portion of the fourth microchannel such that, when a third fluid is present in the third microchannel and a fourth fluid is present in the fourth microchannel, the third fluid and the fourth fluid contact opposite sides of the second membrane.

In a representative embodiment, an assembly comprises a housing, a first substrate, a second substrate, and a membrane disposed between the first and second substrates. The housing having a first inlet, a second inlet, a first outlet and a second outlet. The first substrate comprises a first set of microchannels fluidly coupled at a first end to the first inlet and at a second end to the first outlet. The second substrate comprises a second set of microchannels fluidly coupled at a first end to the second inlet and at a second end to the second outlet. The membrane comprises one or more graphene layers and one or more polymeric layers. The one or more polymeric layers are permeable to a first fluid and permeable to a second fluid, and the graphene layer is impermeable to the first fluid and impermeable to the second fluid such that when the first fluid is present in the first set of microchannels and the second fluid is present in the second set of microchannels the first and second fluids can exchange mass or heat with one another across the membrane without directly contacting one another.

In some embodiments, the assembly has a circular cross-section.

In a representative embodiment, a method comprises flowing a first fluid through a first microchannel defined in a first microchannel substrate and along a first surface of a membrane, the membrane being disposed between the first microchannel substrate and a second microchannel substrate, the membrane comprising a first polymeric layer, a second polymeric layer, and at least one graphene layer disposed between the first and second polymeric layers. The method further comprises flowing a second fluid through a second microchannel defined in the second microchannel substrate and along a second surface of the membrane such that the first and second fluids can interact with one another across the membrane without directly contacting one another.

In some embodiments, the first fluid flows in a first direction, and the second fluid flows in a second direction counter-current to the first fluid. In some embodiments, the first fluid and the second fluid flow co-currently in a first direction. In some embodiments, the method further comprises transferring a plurality of particles from the first fluid to the second fluid through the membrane.

The foregoing and other objects, features, and advantages of the disclosed technology will become more apparent from the following detailed description, which proceeds with reference to the accompanying figures.

BRIEF DESCRIPTION OF THE DRAWINGS

FIGS. 14A-14E illustrate various views of an exemplary embodiment of a microchannel substrate for a microfluidic assembly.

FIG. 30 is a table listing parameters such as size, channel number fluid contact length, etc., for a variety of microchannel system configurations described herein.

DETAILED DESCRIPTION

Certain embodiments of the present disclosure relate to microfluidic assemblies and methods for bringing different fluids near enough to one another to allow interactions between the fluids across a membrane system without allowing the fluids to contact one another or mix. For example, in certain embodiments, the assemblies described herein include channels configured to allow different fluid streams to flow along the membrane system such that interaction between the two fluids can take place. Fluids as referred to herein can include liquids (e.g., organic liquids), gases, and plasmas. In certain examples, the different fluids may be immiscible liquids. For example, one fluid may be an aqueous liquid and one fluid may be a non-aqueous or organic liquid. In certain embodiments, the assembly can be configured to allow fluids to flow along opposite sides of the membrane and interface with one another without contacting one another. The membrane can comprise an inner layer (e.g., a graphene layer) including pores sized to allow selected species (e.g., ions) to pass through the membrane from one fluid to the other without allowing the fluids to contact one another or mix.

Figure 1:
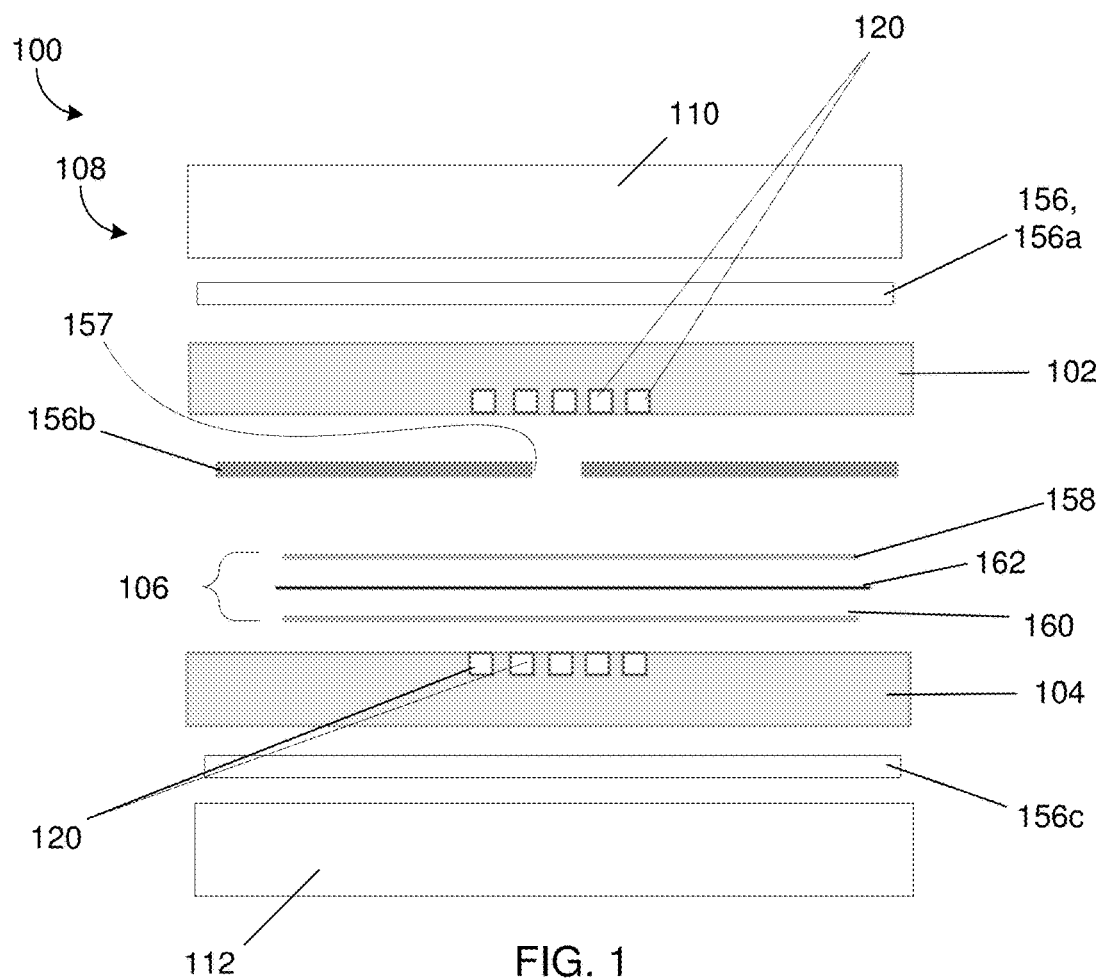
FIG. 1 is an exploded side view of a representative embodiment of a microfluidic assembly.

FIG. 1 illustrates a representative example of a microfluidic assembly 100, according to one embodiment. The assembly 100 can comprise two microchannel substrates 102, 104 (e.g., quartz slides, plates, or "chips") and a membrane system 106 disposed between the substrates 102, 104. The assembly 100 can further include a housing 108 having a first housing portion 110 and a second housing portion 112 that can be assembled together to form the housing 108. In the illustrated embodiment, the housing portions 110, 112 are configured as plates or blocks of material (e.g., metals such as steel or polymeric materials such as polyetheretherketone (PEEK)) defining a plurality of openings 114 (see FIG. 3) configured to receive fasteners (not shown) to secure the housing portions together, although other configurations are possible. In some embodiments, the assembly 100 can make use of standard screw ports, thus making the assembly 100 compatible with and easily incorporated into existing microchannel systems. FIGS. 12A-12D and FIGS. 13A-13C illustrate exemplary embodiments of first and second housing portions that can be used in addition to or in lieu of housing portions 110 and 112. FIGS. 17A-17C and FIGS. 18A-18C illustrate another set of exemplary embodiments of first and second housing portions that can be used in addition to or in lieu of housing portions 110 and 112.

Figure 3:
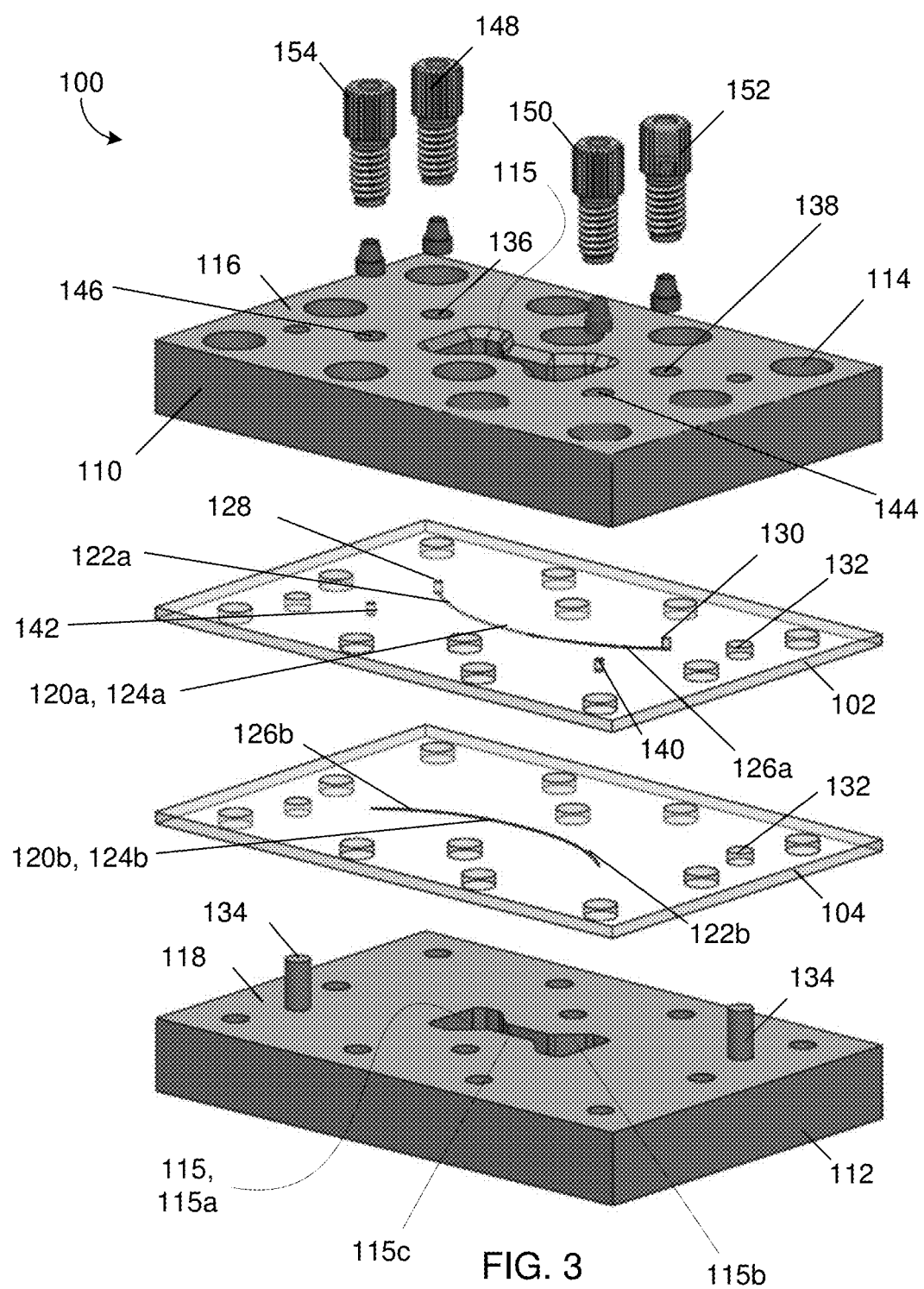
FIG. 3 is an exploded, perspective view of the microfluidic assembly of FIG. 1 with the sealing members and membrane system removed for purposes of illustration.

In some embodiments, as shown in FIG. 3, the first and second housing portions 110, 112 can comprise one or more viewing openings or windows 115 extending through a thickness of the housing portion. In the illustrated embodiment, each viewing opening 115 can comprise a first and second flared end portions 115a, 115b, and a central portion 115c connecting the two flared end portions. The viewing openings 115 can be configured to allow viewing of the microfluidic channels 120 upon assembly of the microfluidic assembly 100.

Figure 2:
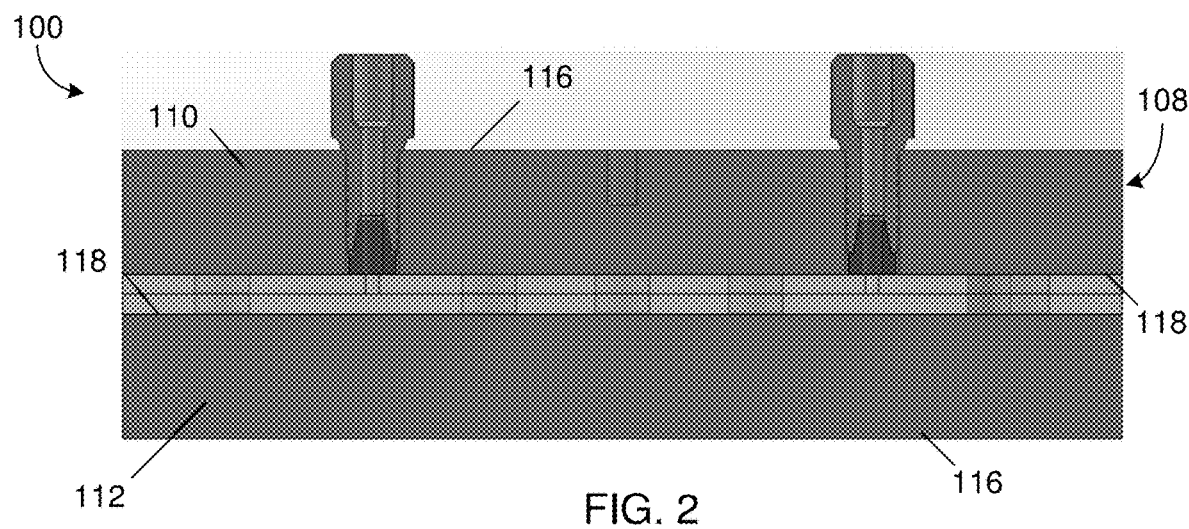
FIG. 2 is a side view of the microfluidic assembly of FIG. 1 in an assembled configuration with the sealing members and membrane system removed for purposes of illustration.
Figure 7:
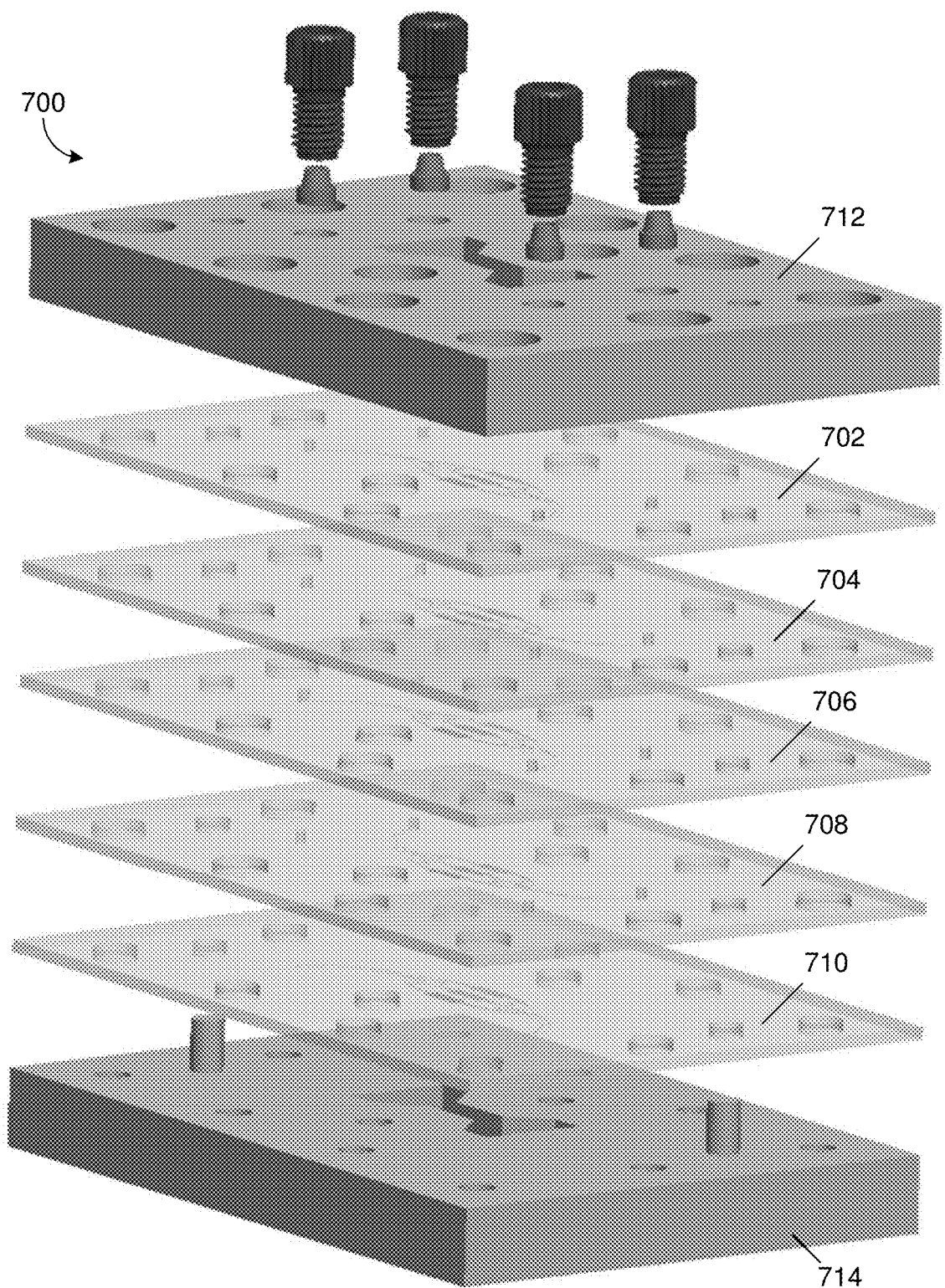
FIG. 7 is an exploded, perspective view of an exemplary embodiment of a microfluidic assembly with the sealing members and membrane system removed for purposes of illustration.

The housing portions 110, 112 can have respective first surfaces (also referred to as exterior surfaces), such as first surface 116 (FIG. 3), and respective second surfaces such as surface 118 (FIG. 3). When the housing portions 110, 112 are assembled together, the first surfaces 116 can be located on the exterior of the housing 108, and the second surfaces 118 can be located on the interior of the housing 108 in an opposed arrangement, as shown in FIG. 2, which omits the sealing members and membrane system for purposes of illustration. The membrane system 106 can be positioned between the housing portions 110, 112 (and therefore between the first and second microchannel substrates) when the housing portions are assembled together. The housing portions 110, 112 can be coupled together using the fasteners (not shown) such that any number of microchannel substrates and/or membrane layers can be disposed between them. For example, in the illustrated embodiment there are two microchannel substrates 102, 104 between housing portions 110, 112. In another example, FIG. 7 illustrates a microfluidic assembly 700 similar to microfluidic assembly 100 except that microfluidic assembly 700 has five microchannel substrates 702, 704, 706, 708, and 710 between housing portions 712, 714.

Referring again to FIG. 1, the microchannel substrates or chips 102, 104 can have a microfluidic design formed from one or more microfluidic channels 120 etched into the surface. In some embodiments, the one or more channels 120 can be etched on one surface of the substrate (e.g., as shown in the illustrated embodiment). However, in other embodiments, a substrate can have microchannels etched on two or more surfaces. For example, a first microchannel can be etched on a first surface of a substrate and a second microchannel can be etched on an opposing second surface of a substrate.

Figure 19A:
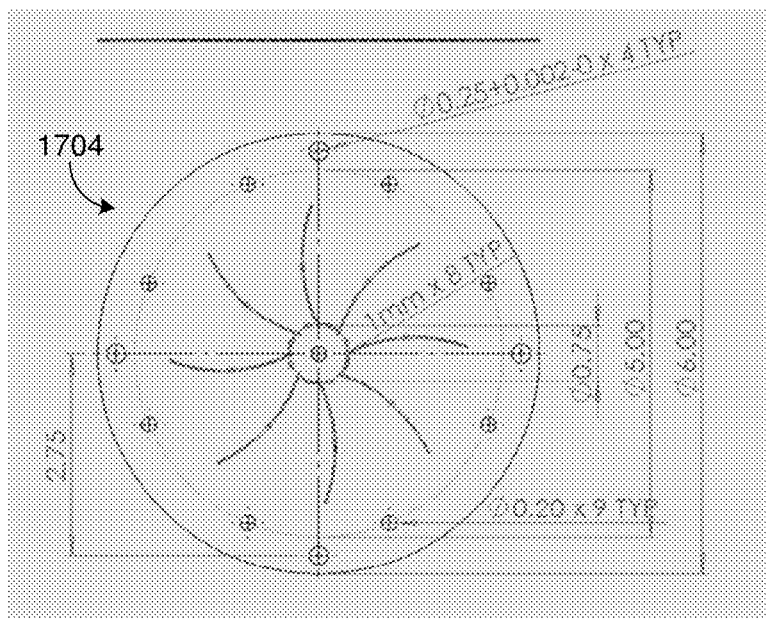
FIGS. 19A-19B illustrate various views of an exemplary microchannel substrate for a microfluid assembly having a circular cross-section.
Figure 19B:
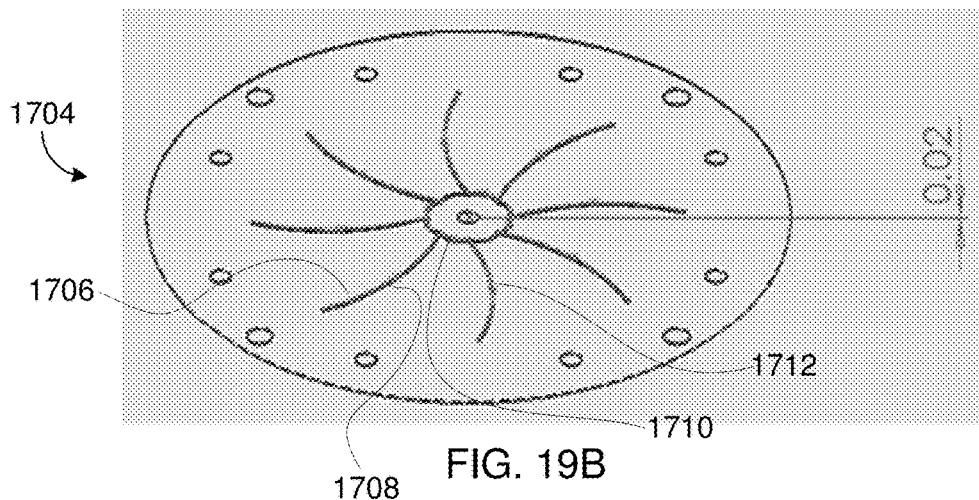

FIGS. 14A-14E illustrate an exemplary embodiment of a substrate that can be used in lieu of or in addition to substrates 102 and 104. FIGS. 19A-19B illustrate another exemplary embodiment of a substrate that can be used in lieu of or in addition to substrates 102 and 104.

The channel design formed by the one or more microfluidic channels 120 can be variable based on the purpose for which the microfluidic assembly 100 is used. For example, FIGS. 21-25 show a variety of different microfluidic channel designs, as described in more detail below.

Referring again to FIG. 3 (which omits the sealing members and membrane system for purposes of illustration), each channel 120 (e.g., first channel 120a and second channel 120b) can include a first portion 122 configured as an inlet portion, a second portion 124 configured as a main portion, and a third portion 126 configured as an outlet portion. The first microchannel substrate 102 can be placed on top of the second microchannel substrate 104 (or vice versa) such that respective main portions 124a, 124b of the channels 120a, 120b at least partially overlap. For example, first and second microchannel substrates 102, 104 can be stacked or interleaved (with the membrane system 106 between them) such that a lower surface of the first channel 120a in the first substrate 102 is coextensive with an upper surface of the second channel 120b in the second substrate 104 on opposite sides of the membrane system 106.

In the illustrated embodiment, channels 120a and 120b are curved in opposing directions such that the main portions 124a, 124b of the channels overlap. However, in other embodiments, different channel configurations can allow a greater or lesser area of the channels to overlap. For example, in other embodiments the main portions 124a and 124b, or respective portions thereof, may be straight such that they align with each other.

The first microchannel substrate 102 can define an opening 128 configured as an inlet opening in fluid communication with the inlet portion 122a of the first channel 120a and a corresponding outlet opening 130 in fluid communication with the outlet portion 126a of the first channel 120a. The first substrate 102 can also define openings 132 configured to receive members of the second housing portion 104 configured as alignment pins 134. The inlet opening 122a can be aligned and in fluid communication with an inlet opening 136 defined in the first housing portion 110. The outlet opening 130 can also be aligned and in fluid communication with an outlet opening 138 defined in the first housing portion 110. The first substrate 102 can also include inlet and outlet openings 140, 142, respectively, in fluid communication with inlet and outlet portions 122b, 126b of the second channel 120b as well as respective inlet and outlet openings 144, 146 of the first housing portion 110. The second substrate 104 can also include openings 132 configured to receive alignment pins 134. As described above, the inlet and outlet openings are positioned for counter-current flow of fluids through the channels 120a, 120b, however, any inlet opening can be used as an outlet opening and vice versa and the assembly 100 can also be used for co-current flow.

The first housing portion 110 can further include inlet fittings 148, 150 and outlet fittings 152, 154 through which fluids may be introduced into and/or withdrawn from the assembled housing 108. The inlet fittings 148, 150 can be in fluid communication with the inlet openings 136, 144 of the first housing portion 110 and the inlet openings 128, 140 of the first substrate 102 such that fluid can be introduced to the first and second channels 120a, 120b. The outlet fittings 152, 154 can be in fluid communication with the outlet openings 138, 146 of the first housing portion 110 and with outlet openings 130, 142 of the first substrate 102 such that fluid can be withdrawn from the first and second channels 120a, 120b.

The microchannel substrates 102, 104 can accommodate a range of channel 120 designs, as shown in FIGS. 21-25. These channel designs are not intended to be limiting, and any microfluid channel design could be used. Different channel configurations can allow the assembly 100 to incorporate features such as parallel channels (see e.g., FIGS. 22-24) and multiple layers of quartz chips (see e.g., FIG. 7), increasing the length and area over which the fluids are flowed and contacted, thus allowing for a higher exchange of ions and/or mass. For example, certain designs can provide: (1) additional fluid flow allowing a greater volume of fluid to pass through the assembly 100 more quickly; (2) increased interface time between the fluids (e.g., to provide additional purification, etc.); (3) maximized microfluidic drawing areas; and (4) larger and longer mass transfer areas and path lengths.

Referring again to FIG. 1, the assembly 100 can further comprise one or more sealing members 156. The one or more sealing members 156 can be disposed between each housing portion 110, 112, and each substrate 102, 104, and/or between each pair of substrates 102, 104 where the microfluidic assembly includes multiple pairs of substrates. For example, three sealing members 156 are illustrated in FIG. 1, although the device may include more or fewer layers, as desired. First sealing member 156a is disposed between the first housing portion 110 and substrate 102, the second sealing member 156b is disposed between first substrate 102 and second substrate 104, and the third sealing member 156c is disposed between second substrate 102 and second housing portion 112. In the illustrated embodiment, the second sealing member 156b is disposed above (in the orientation shown in FIG. 1) the membrane system 106 such that it is located between the membrane system 106 and the first substrate 102. However, in other embodiments, the second sealing member 156b can be disposed below the membrane system 106 such that it is located between the membrane system 106 and the second substrate 104. In certain embodiments, the sealing members 156 can be configured as thin ethylene tetrafluoroethylene (ETFE) gaskets.

The second sealing member 156b can have a length and width greater than the length and width of the membrane system 106. Accordingly, when the second sealing member 156b is laid atop the membrane system 106, edge portions of the second sealing member 156b can extend past edge portions of the membrane system 106. When the microfluidic assembly 100 is assembled, the portions of the second sealing member 156b that extend past the membrane system 106 can extend or fold around the edges of the membrane system 106 and contact the second substrate 104, forming a seal around the membrane system 106. Thus, the microchannels 120 of the substrate 102 can be sealed or fluidically isolated from the microchannels 120 of the substrate 104 by the sealing member 156b and the membrane system 106, and a second sealing member between the membrane system 106 and the substrate 104 is not required. However, in other embodiments, a second sealing member can be disposed between the substrate 104 and the membrane 106 and configured to seal against the sealing member 156b. In yet other embodiments, the sealing member 156b can be positioned between the substrate 104 and the membrane 106 and can fold around the membrane 106 and seal against the substrate 102.

In some embodiments, one or more of the sealing members 156 can comprise a viewing opening 157. For example, in the illustrated embodiment, the second sealing member 156b comprises a viewing opening 157. In other embodiments, all three sealing members 156a, 156b, and 156c can comprise viewing openings. The viewing opening(s) 157 can be configured to allow viewing of the microfluidic channels 120 upon assembly of the microfluidic assembly 100.

The sealing members 156 can be flexible enough to cushion the substrates 102, 104 between the housing portions 110, 112, allowing them to be held firmly without breaking. The sealing members 156 can also act as a way to seal the fluid inside of the assembly 100 to mitigate or prevent leaking without sacrificing performance. In some embodiments, the sealing members 156 can surround the membrane system 106. For example, with reference to FIG. 1, the sealing member 156b disposed between the substrates 102, 104 can define an opening having the approximate size and shape of the membrane system 106.

The membrane system 106 can be disposed between the substrates 102, 104 and can separate the channels 120 etched on each substrate 102, 104. In some embodiments, the membrane system 106 can be, for example, approximately 250 nm thick. The membrane system 106 prevents or mitigates fluids flowing through the assembly 100 from mixing or contacting each other directly. In some embodiments, the membrane system has a porosity of 50%. The membrane-separated-channels can allow two or more fluids to flow co-currently or counter-currently across one another and perform ion exchange, mass transfer, and a variety of other applications across the membrane. The assembly 100 can also be configured to provide serpentine flow in two dimensions, or in three dimensions (e.g., between multiple microchannel substrate pairs).

As shown in FIG. 1, the membrane system 106 can comprise a first polymeric layer 158, a second polymeric layer 160, and at least one graphene layer 162 disposed between the first and second polymeric layers 158, 160. In some embodiments, the membrane system can comprise a plurality of graphene layers disposed adjacent one another. In other embodiments, the membrane system can comprise a plurality of alternating polymeric layers and graphene layers.

The polymeric layers can be permeable such that fluid can flow through them, and the graphene layer(s) can be impermeable such that fluid is prevented from flowing through the graphene layer(s). For example, in the illustrated embodiment, the first polymeric layer 158 can be permeable at least to the first fluid and the second polymeric layer 160 can be permeable to at least the second fluid. The graphene layer or layers 162 can be impermeable to the first and second fluids such that the first and second fluids cannot pass through the graphene layer, but such that selected species such as ions can pass through the membrane from one fluid to the other without allowing the fluids to contact one another or mix. In some embodiments, the polymeric layers can comprise pores that allow the fluid(s) to pass through the polymeric layers and contact the graphene layer(s).

The at least one graphene layer 162 can be a monolayer sheet of graphene (e.g., polycrystalline graphene) and/or can comprise a graphene derivative. The graphene layer 162 can be formed, for example, using the method illustrated in FIG. 26. As shown, a layer of graphene can be deposited (e.g., using chemical vapor deposition (CVD)) on a metallic substrate (e.g., copper or nickel foil). The graphene and the metallic substrate can be supported by a thin polymer film (e.g., formvar) and the polymer film can be air-dried. The metallic substrate can then be etched using a solvent (e.g., ferric chloride, $FeCl_3$), thus removing the metallic substrate and leaving only the graphene layer and the polymer film. The polymer-graphene system can then be rinsed in deionized water and transferred to a target substrate. The polymer layer can then be dissolved using a solvent (e.g., chloroform), thus leaving the graphene layer on the target substrate.

Figure 4:
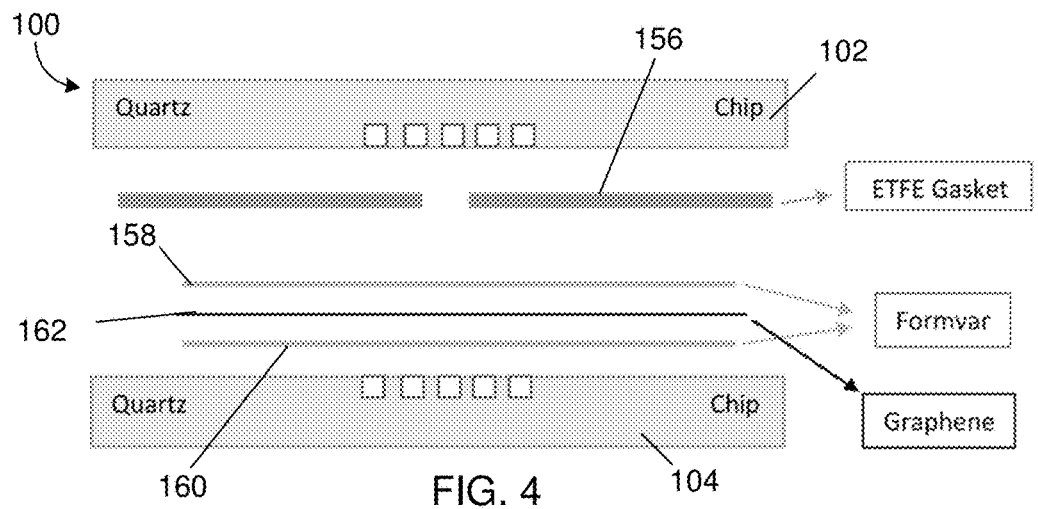
FIGS. 4-6 are exploded side views of exemplary embodiments of microfluidic assemblies.
Figure 5:
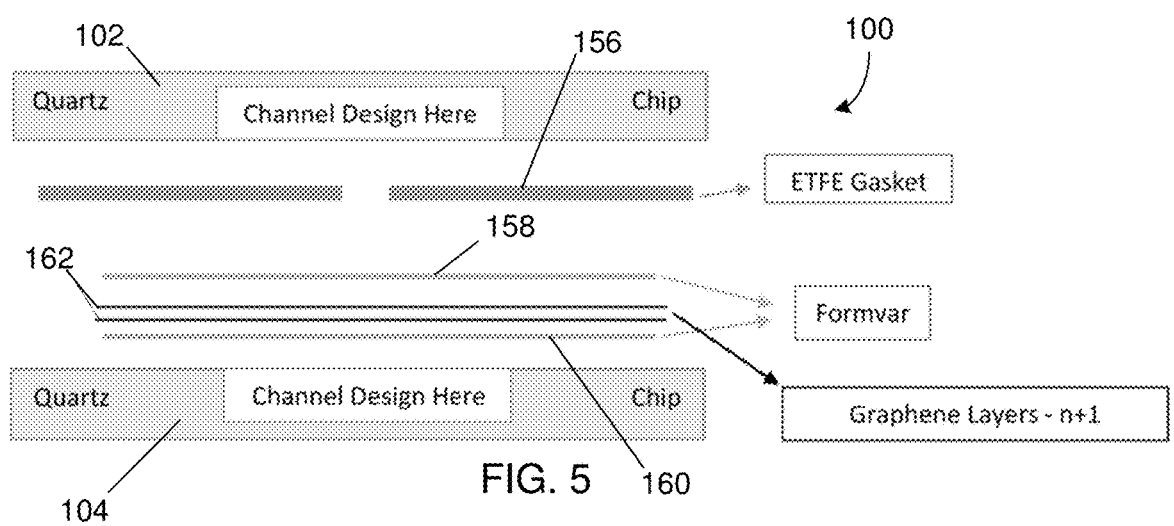
Figure 6:
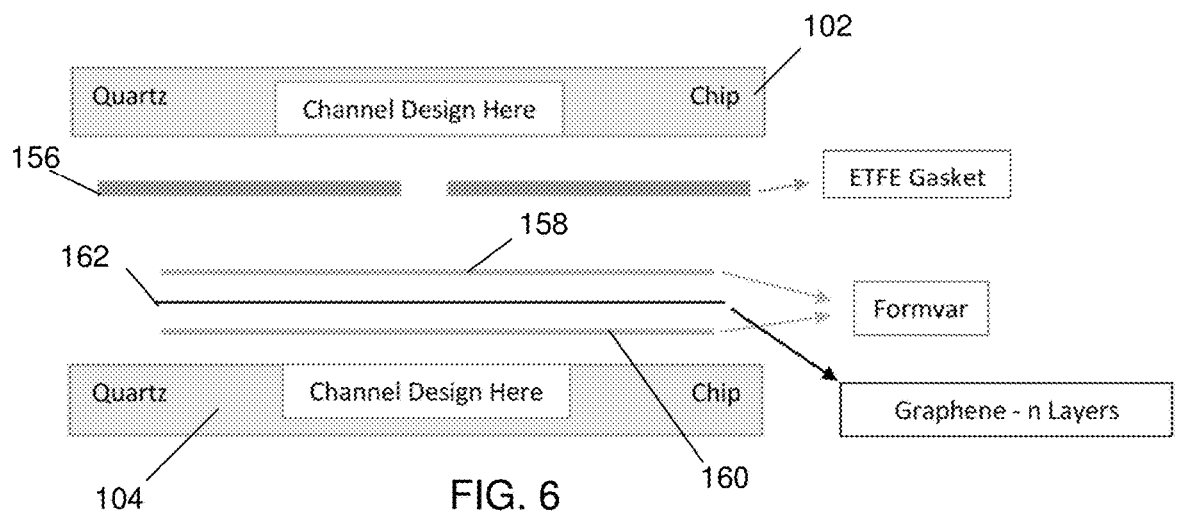

As shown in FIG. 4, in some embodiments, the graphene layer 162 can comprise a single graphene monolayer. A graphene monolayer is a layer of graphene one atom thick. Thus, in certain embodiments the graphene layer 162 can have a thickness as low as $1 \times 10^{-10}$ m to $5 \times 10^{-10}$ m. However, in other embodiments, as shown in FIG. 5, the graphene layer 162 can comprise any number of graphene monolayers.

The graphene layer 162 can be disposed between first and second polymeric layers 158, 160. The polymeric layers 158, 160 can support the graphene layer 162 and help prevent bending or breaking of the graphene. In some embodiments, the polymeric layers 158, 160 can give the graphene layer 162 the necessary support to withstand fluid flows of 10 microliters per minute through 100 micrometer channels.

The polymeric layers 158, 160 can comprise, for example, relatively thin films formed from any of a variety of thermoplastic resins, such as polyvinyl polymers or copolymers. In certain embodiments, the polymeric layers 158 and 160 can comprise a polyvinyl formal resin such as formvar. In other embodiments, copolymer composites can be used, for example, a parylene/formvar composite. The polymeric layers 158 and 160 can be porous, and can have a pore size (e.g., pore diameter) and pore density such that the polymeric layers have sufficient strength to support the graphene layer 162 while still allowing the fluid to pass through the pores of the polymeric layers and interact with or contact the graphene layer 162. For example, in some embodiments the polymeric layers 158, 160 can be approximately 125 nm thick, and can have an average pore area of 1 $\mu m^2$ to 10 $\mu m^2$, 1 $\mu m^2$ to 5 $\mu m^2$, or 1 to 2.3 $\mu m^2$, and a porosity of between 10% to 80%, 20% to 70%, or between 20% to 65%. Formvar is hydrophilic and oleophilic, inert to most chemicals, and resistant to radiation. As used herein, a "hydrophilic" material refers to a material wherein a water droplet on a surface of the material forms a contact angle of less than 90 degrees. Where the polymeric layers comprise formvar, the formvar films can be made with tunable porosities, which can allow variation in membrane system transfer properties (e.g., rates of mass and/or heat transfer).

The polymeric layers 158, 160 can provide the atomically thin graphene layer 162 the necessary support to span large distances, such as across the channel width and length, and to handle fluid flows that might otherwise destroy the graphene layer 162. In some particular embodiments, the total membrane thickness can be approximately 125 nm. In some particular embodiments, the depth and width of the microchannels can be approximately 100 µm. Thus, in certain embodiments the width of the microchannels can be one million times the thickness of the graphene layer, or more.

In use, the membrane system 106 (including graphene layer 162, and polymeric layers 158, 160) can be positioned between the first and second substrates 102, 104 (with one or more sealing members 156 optionally included as well). The substrates 102, 104 can be positioned such that the respective main portions 124a, 124b of the first and second channels 120a, 120b overlap each other. A first fluid can flow through the first channel 120a, and can be prevented from flowing into the second channel 120b by the membrane system 106, which is disposed between the first and second channels 120a, 120b. A second fluid (which may be immiscible with the first fluid) can flow through the second channel 120b, on the opposite side of the membrane system 106. The first and second fluids can interface with one another through the membrane system 106. This allows the fluids, or solutes dissolved in one or both fluids, to interact with each other along the length of the main portions 124a, 124b of the channels 120a, 120b without contacting or mixing the fluids. This can also allow the transfer of heat from one fluid to another. In other words, the channels 120a, 120b can conduct the fluids along opposite sides of the membrane system 106 allowing the fluids to interface through the membrane system such that interactions, for example, heat or ion transfer, can occur between the fluids without mixing the fluids.

As shown in FIGS. 8-11, and discussed in further detail below, various properties of the graphene layer 162 can be selected for or "tailored" to allow for further selectivity of the membrane system 106. For example, the graphene can be functionalized to achieve certain properties. Functionalization of the graphene can be achieved in numerous ways, for example, by changing the surface of the structure. Functional groups and/or structures such as nanoparticles, organic molecules, oxide layers, etc. can be attached to the graphene layer 162 (FIGS. 9 and 10) using doping or other reactions, giving the graphene layer 162 specific properties. The graphene layer may also be configured to include holes and/or pores of the same or varying sizes (FIG. 11), defects, vacancies, increased or decreased hydrophilicity, oleophilicity, and/or wettability, and/or magnetic, conductive, or catalytic affinity to interact with certain molecules. Furthermore, changing the shapes and sizes of the polymeric layers 158, 160, as well as changing the types of polymers themselves can be used to give the polymer layers 158, 160 resistance to certain fluid systems, and/or additional support from pressures induced by fluid flow rates, differences in viscosities, etc.

The membrane system 106 can be used for a variety of applications, including, but not limited to: nanofiltration, analytical chemistry for preparing samples by extracting interfering compounds; gas sensors and on-line analysis; pharmaceutical manufacturing; medical diagnostics; plasma and blood separations; liquid-liquid extraction separations; metal and ion recycling; and protein synthesis and separation. Some particular nanofiltration applications can include: non-thermal solvent recovery and management; room temperature solvent exchange; removal of tar components; purification of gas condensates; recovery of catalysts; and extraction of amino acids and/or lipids from blood. Accordingly, the membrane system 106 can be configured to allow the transfer of heat and/or particles. For example, in some embodiments, the particles can include hydrated monovalent ions, sodium ions such as sodium chloride (NaCl), blood cells, amino acids, lipids, metal ions, etc.

The functionalized and/or tailored graphene layers 162, along with the other modifiable components of the assembly 100 (e.g., the polymeric layers 158, 160 and the microchannel 120 designs) allow the assembly 100 to be configured for various uses. In some embodiments, the assembly 100 can be used for liquid-liquid extraction such as, for example, desalination, chemical purification, biological purification, and industrial pollution control. In a particular embodiment, the assembly 100 can be used to remove actinides from liquid waste streams that occur as a result of fuel fabrication or maintenance. The removed actinides can then be reclaimed and recycled.

Figure 8:
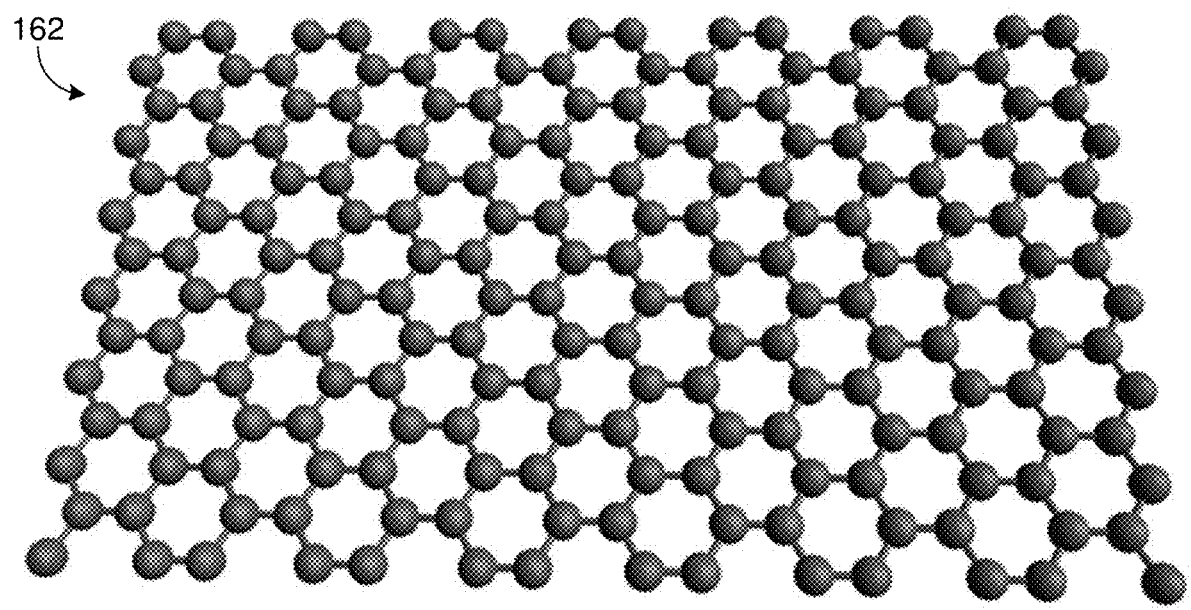
FIGS. 8-11 illustrate exemplary embodiments of graphene layers.

In some embodiments, as shown in FIG. 8, the graphene layer 162 is pristine graphene, that is, graphene without holes or pores, without attached functional groups, and having a low amount of defects. In other embodiments, graphene layer derivatives can be used, including exfoliated and/or functionalized graphene. For example, graphene oxide has a different surface topography and surface chemistry than pristine graphene, which can be beneficial in certain applications.

Figure 9:
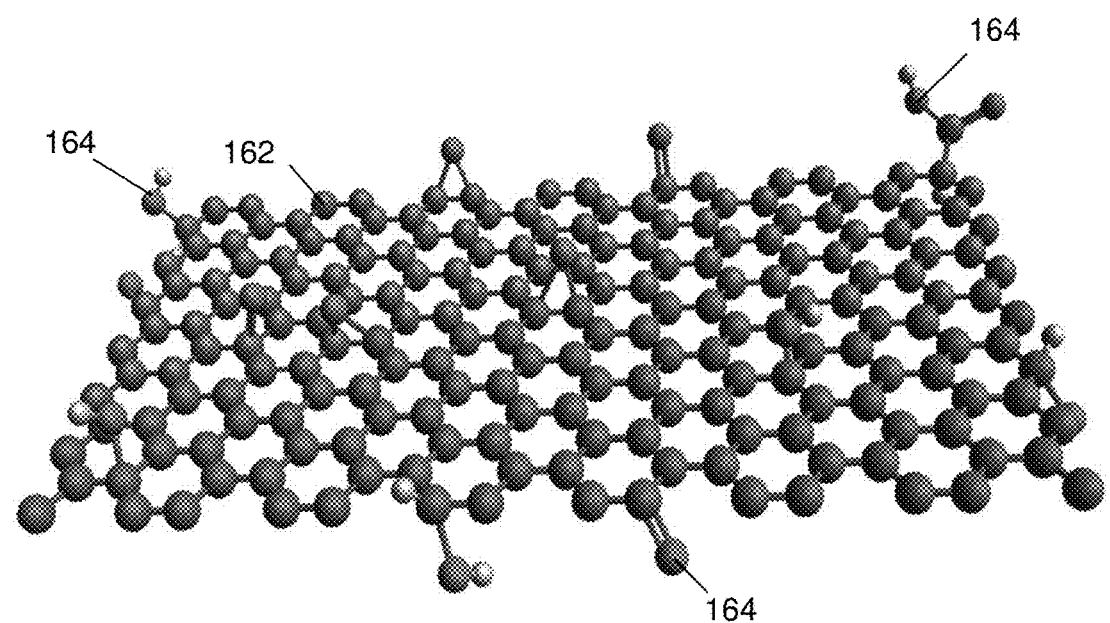
Figure 10:
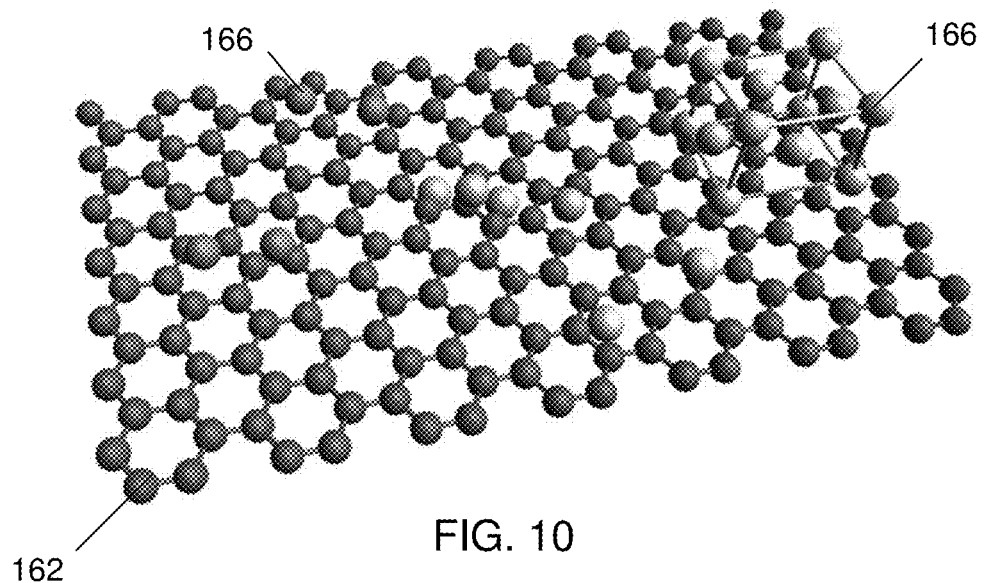

In particular embodiments, the graphene layer 162 can be functionalized in the following exemplary manners. Referring now to FIG. 9, additional molecules, such as oxides and other functional groups 164 can be added to the graphene layer 162 to modify the chemical properties of the membrane system 106 and/or increase the surface area or reactivity. For example, the hydrophilicity and surface energy can be altered. As shown in FIG. 10, nanoparticles 166 (e.g., metals) can be used to add magnetism or other inherent nanoparticle properties to the graphene layer 162. Quantum dots or different nanoparticle types can introduce different physical properties to the graphene layer and/or metals can be doped onto the surface of the graphene layer. In some embodiments, these additions can induce or alter the graphene layer's magnetic, catalytic, conductive, and/or other properties. Coating and/or doping the graphene layer can increase resistivity of the membrane system 106 to certain chemical systems, can alter the performance of the membrane system, and can change the thickness and/or effectiveness of the membrane system 106.

Figure 11:
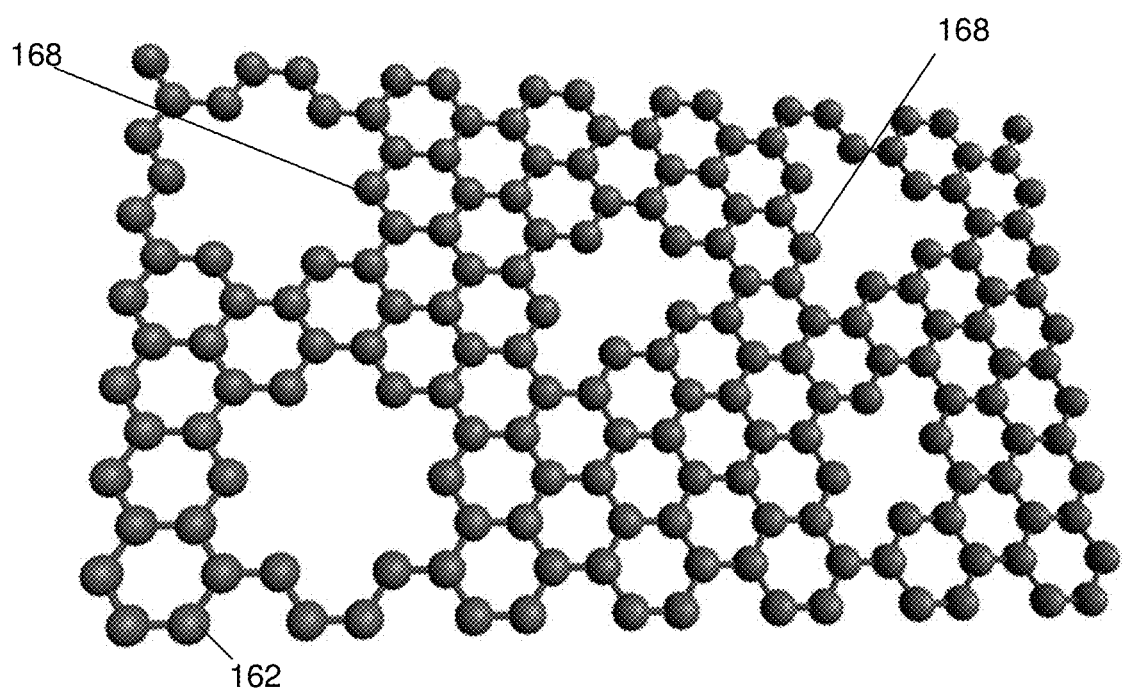
Figure 12A:
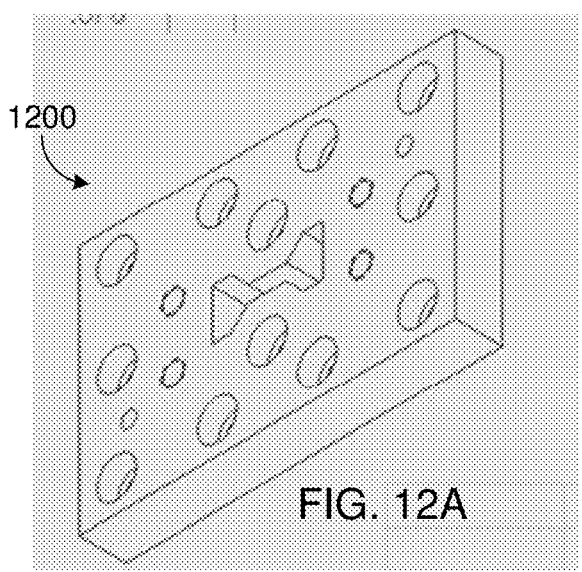
FIGS. 12A-12D illustrate various views of an exemplary embodiment of a first housing portion for a microfluidic assembly.
Figure 12B:
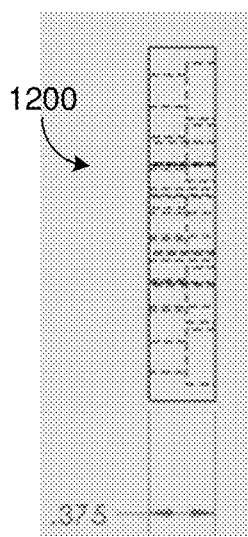
Figure 12C:
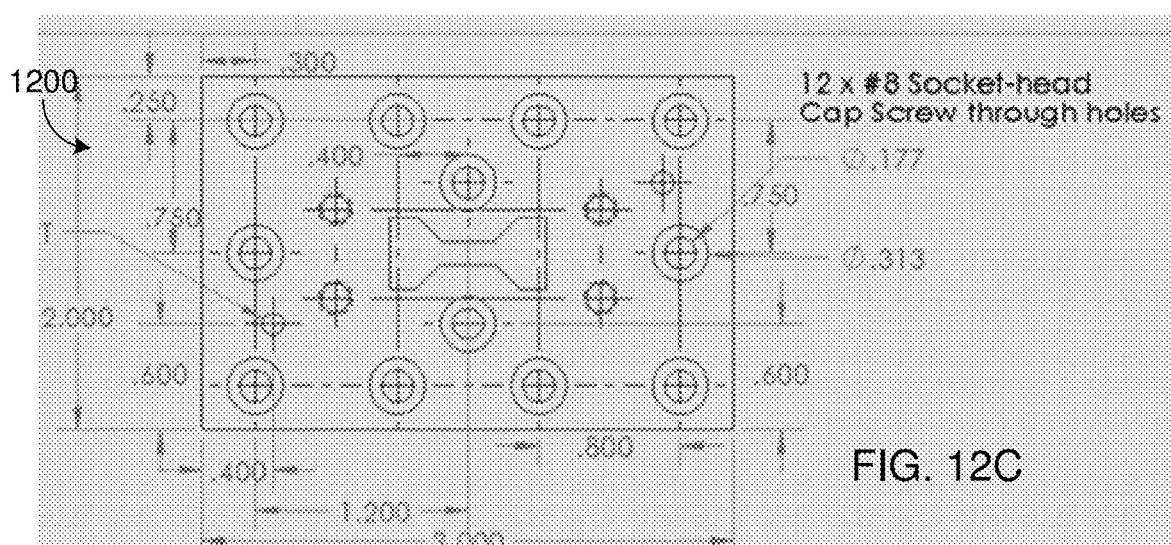
Figure 12D:
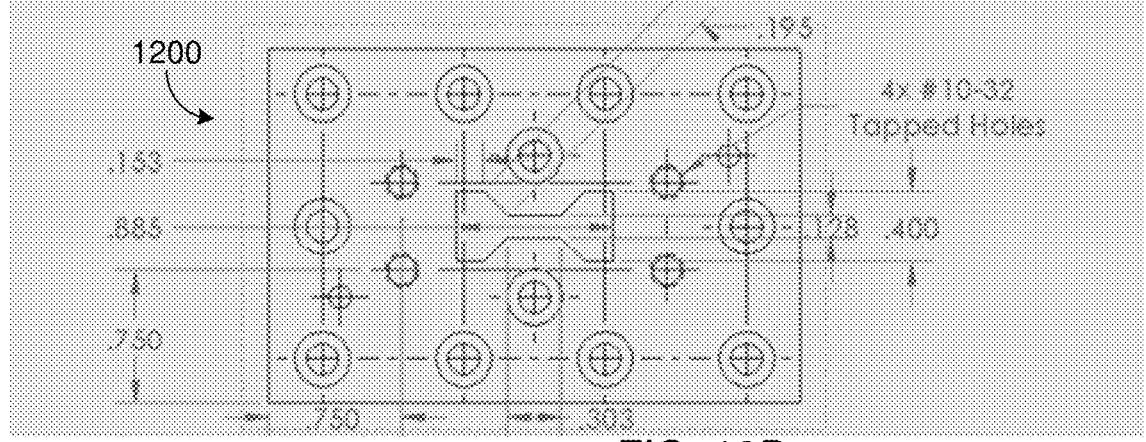
Figure 13A:
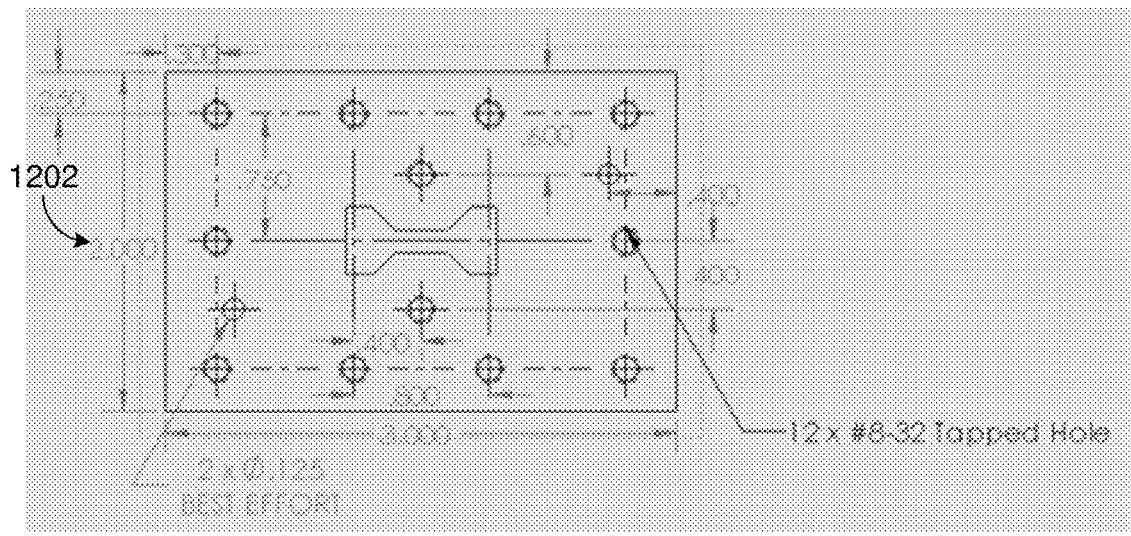
FIGS. 13A-13C illustrate various views of an exemplary embodiment of a second housing portion for a microfluidic assembly.
Figure 13B:
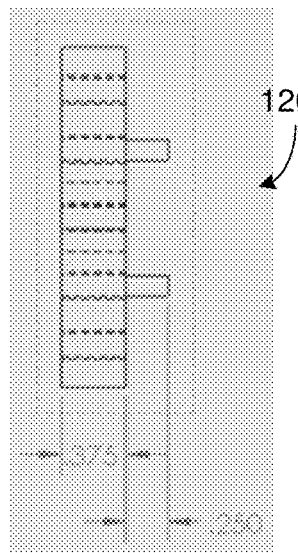
Figure 13C:
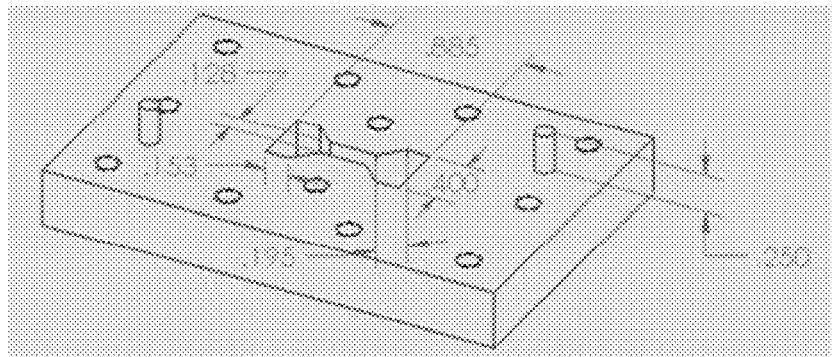

In some embodiments, the graphene layer 162 can be treated (e.g., using chemical bonds) to make sieving possible by inducing pores or holes 168 in the structure of the graphene layer 162, as shown in FIG. 11. Treatment can include changing bond lengths and/or removing atoms in order to induce different structures on the graphene layer surface, changing the size of holes or pores, and/or changing the selectivity of holes or pores. Treatments can also be used to attach catalysts and/or other functional groups to the surface of the graphene layer. Catalysts can be carried by the graphene layer in order to induce chemical reactions. Catalysts can also be used to change the reaction rates of chemical reactions induced at the graphene layer.

The polymeric layers 158, 160 can also be used to affect the graphene layer 162.

Different polymeric layers 158, 160 can provide different support structures or topographies, which can alter the properties of the graphene layer 162. Additionally, differing polymers, combinations of polymers, and polymer chains can be used to protect the graphene layer from chemical reactions and alterations of surface chemistry.

As mentioned previously, channels 120 etched into the surface of the substrate 102, 104 can define a flow path for fluid introduced into the housing 108. Each channel 120 can be on the order of hundreds of micrometers (e.g., 1 micrometers wide and 100 micrometers deep) and can be cut into the microchannel substrate 102, 104 using, for example, a femtosecond laser. The microfluid designs can be configured to maximize interface area, reaction length, and/or or mass transfer area between the different fluids by fanning out or dividing into a plurality of channels to form small or large mass transfer areas. These parameters may vary depending on, for example, the width, length, and number of channels.

Figure 21:
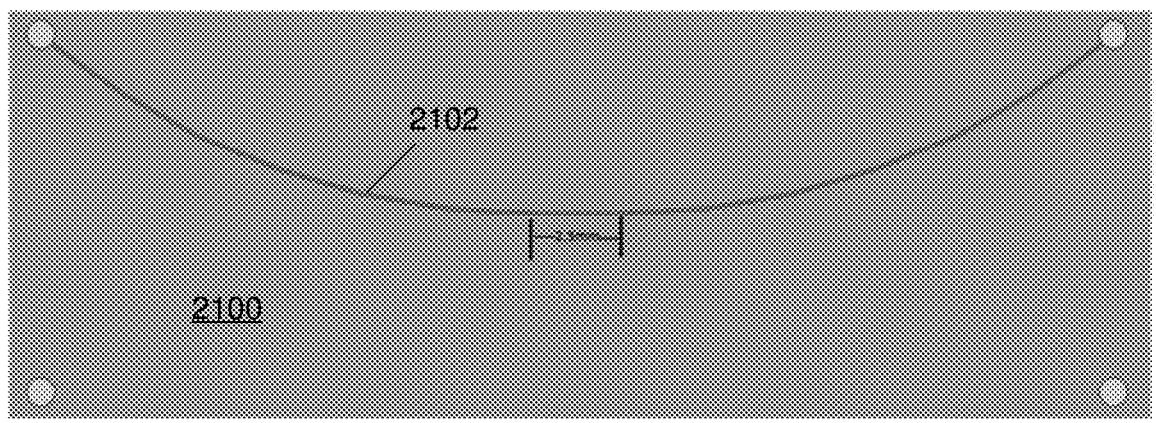
FIGS. 21-25 illustrate various exemplary embodiments of microfluidic channel designs.
Figure 22:
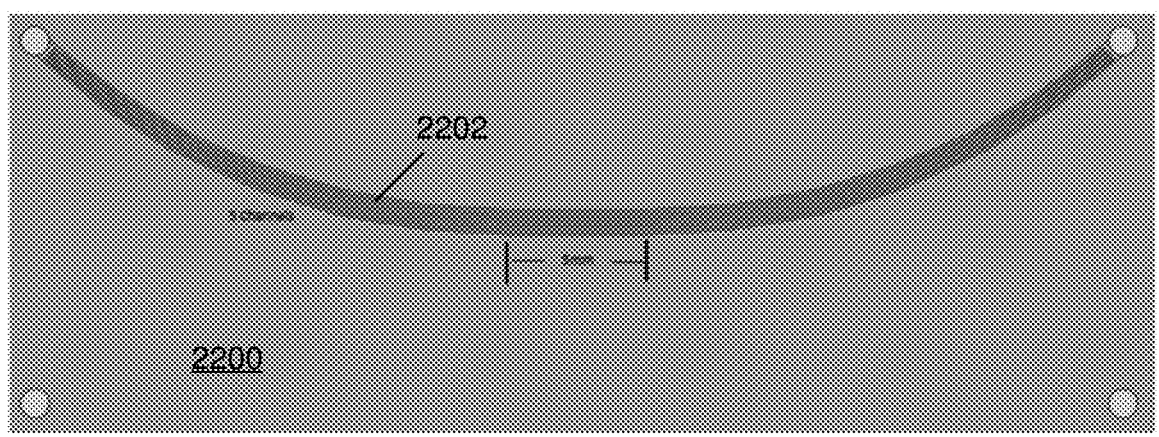
Figure 23:
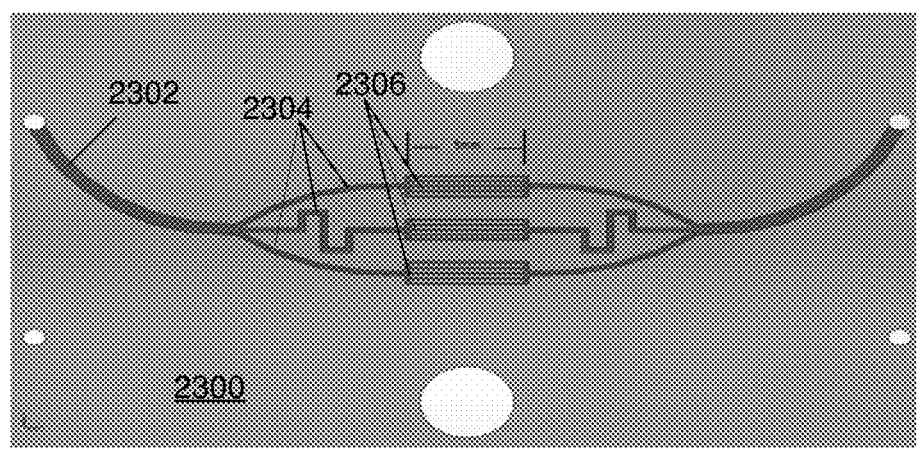
Figure 24:
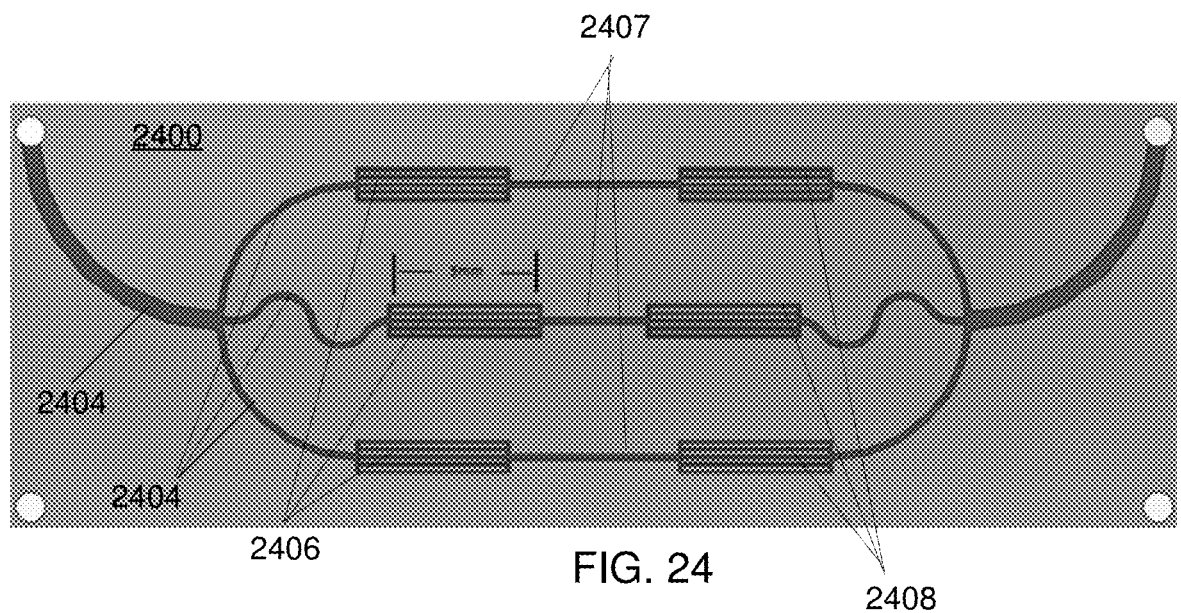
Figure 25:
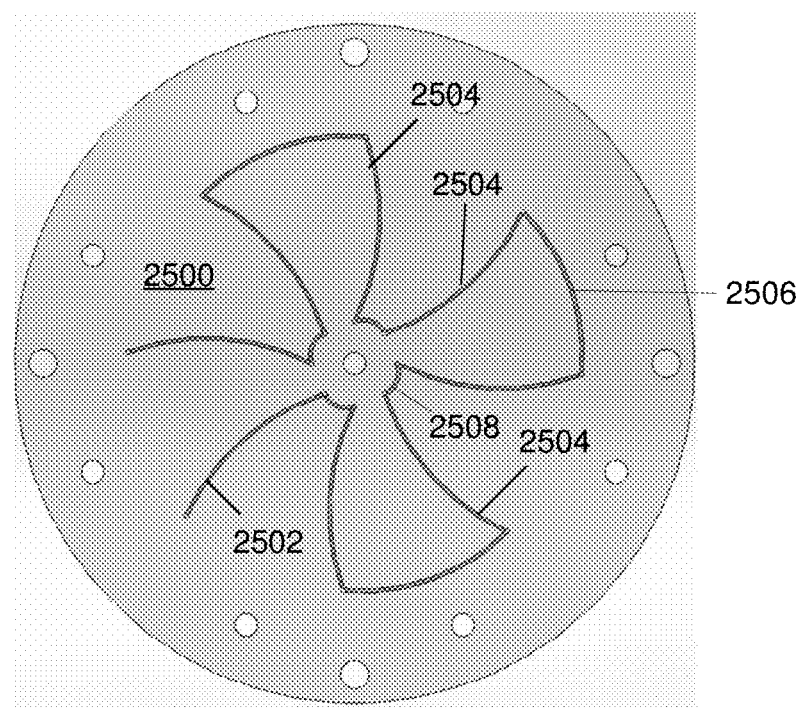

As shown in FIGS. 21-25, one or more substrates of a microfluidic assembly can comprise a variety of different microfluidic channel designs. For example, as shown in FIG. 21, in some particular embodiments, a substrate 2100 can comprise a single channel 2102. In other embodiments, as shown in FIG. 22, a substrate 2200 can comprise a plurality of channels 2202 (e.g., 5 channels) disposed adjacent one another. In some embodiments, the microchannel designs can comprise branching designs wherein a channel splits into two or more smaller channels. For example, as shown in FIG. 23, a substrate 2300 can comprise a first microchannel 2302 that splits into a plurality of microchannels 2304 (e.g. three microchannels), each of which can split into a plurality of additional parallel microchannels 2306. In this way the surface area of the microchannels can be increased to allow for additional flow along the membrane. In the embodiment illustrated in FIG. 23, the center microchannel 2304 can comprise a plurality of angles or bends in the channel, such that the overall length of the central channel is equal or nearly equal to the curved microchannels above and below it. In still other embodiments, such as shown in FIG. 24, a substrate 2400 can comprise a first microchannel 2402 that splits into a plurality of microchannels 2404 (e.g., three microchannels), each of which can split into a plurality of additional microchannels 2406 that converge again into a plurality of microchannels 2407, and split into a second set of additional microchannels 2408. Splitting the microchannels into smaller parallel channels provides additional mechanical support for the membrane system as it is suspended over the channels. The portions of the substrate 2400 between the additional microchannels 2406, 2408 mitigate or prevent the membrane system from collapsing. The groupings of parallel microchannels in a downstream sequence can also be configured to provide separate reaction or interaction zones where ions, heat, etc., can be transferred between fluids flowing on opposite sides of the membrane 106. As in the configuration of FIG. 23, the center microchannel 2404 can comprise a curved shape such that it has a length similar to the curved microchannels on either side. In some embodiments, such as shown in FIG. 25, a substrate 2500 can comprise a microchannel 2502 having a shape that comprises curved radially-extending portions 2504 interconnected by curved angularly-extending portions 2506 having a first, outer radius, and curved angularly-extending portions 2508 having a second, inner radius such that the microchannel has a fan-like or flower-like shape.

Figures 26, 27:
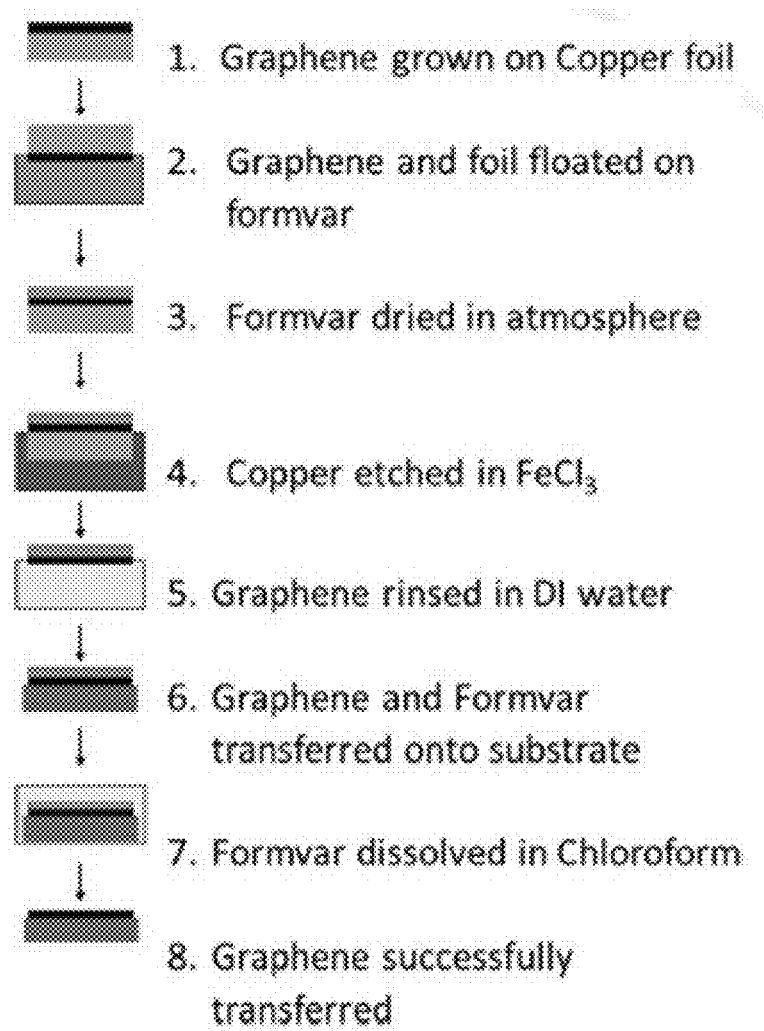
FIG. 26 illustrates an exemplary embodiment of a method for creating graphene layers.
FIG. 27 shows exemplary maximum flow rates for microfluidic assemblies having varied components.

The disclosed assemblies can be scaled to increase throughput. For example, in some embodiments, multiple microfluidic assemblies 100 including respective membrane systems 106 can be stacked on top of or adjacent one another. In a particular example, multiple microchannel substrates can be layered to achieve a 1.5 mL/min throughput. FIG. 27 shows a chart of exemplary maximum flow rates for different channel configurations, flow types, and mass transfer path lengths. FIG. 30 shows a table of assembly sizes and the estimated flow rates associated therewith.

As shown in FIGS. 12A-14E, in some embodiments, the microfluidic assembly 100 can have a rectangular cross-section. In a particular embodiment, as shown in FIGS. 12A-13C, an exemplary housing portion 1200 can have a rectangular cross-section having a length of 3 inches (i.e., 72.6 mm), a width of 2 inches (i.e., 50.8 mm), and a thickness of 0.375 inches (i.e., 9.5 mm). FIGS. 12A-D show various views of the exemplary first housing portion 1200, which is similar to first housing portion 110, for a microfluidic assembly having a rectangular cross-section. FIGS. 13A-C show various views of an exemplary second housing portion 1202, similar to second housing portion 112, for a microfluidic assembly having a rectangular cross-section. FIGS. 14A-E show various views of an exemplary microchannel substrate 1204, similar to substrates 102, 104 for a microfluidic assembly having a rectangular cross-section.

Figure 15:
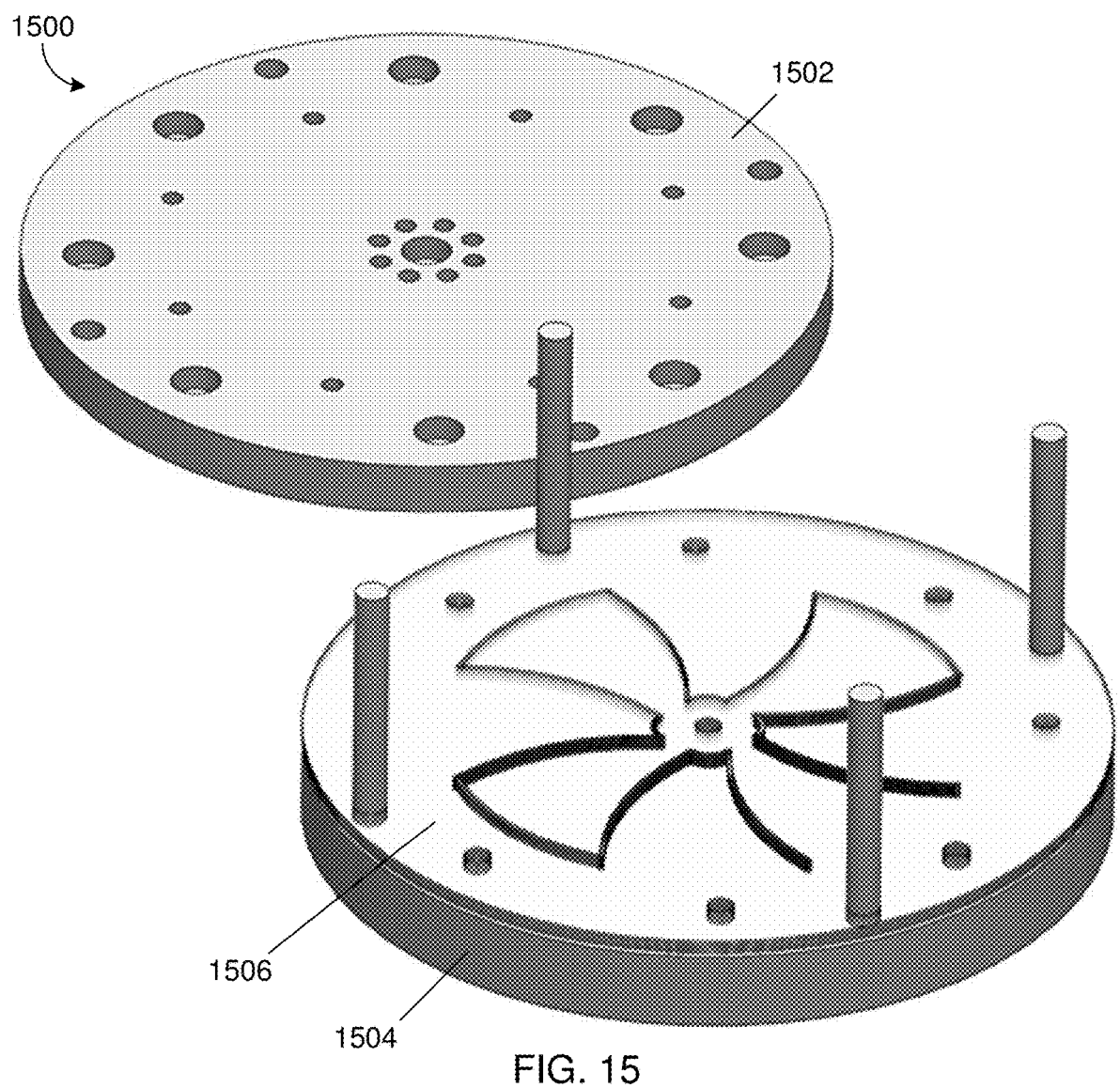
FIG. 15 is an exploded view of an exemplary embodiment of a microfluidic assembly with the sealing members and membrane system removed for purposes of illustration.

In other embodiments (see FIGS. 15-19B and 25), the microfluidic assembly can have a round (e.g., circular) cross-section. A circular cross-section can help maximize the functional area of the microchannel substrate surface, that is, the area of the surface that can be etched with microchannels. FIG. 15 shows an exemplary housing 1500 having first and second housing portions 1502 and 1504, and a substrate 1506 configured similarly the substrate 2500 of FIG. 25. The housing portions 1502 and 1504, and the substrate 1506 can be similar to the housing 108 and substrates 102, 104 of the microfluid assembly 100 except that housing 1500 and the substrate 1506 have a circular cross section.

Figure 16:
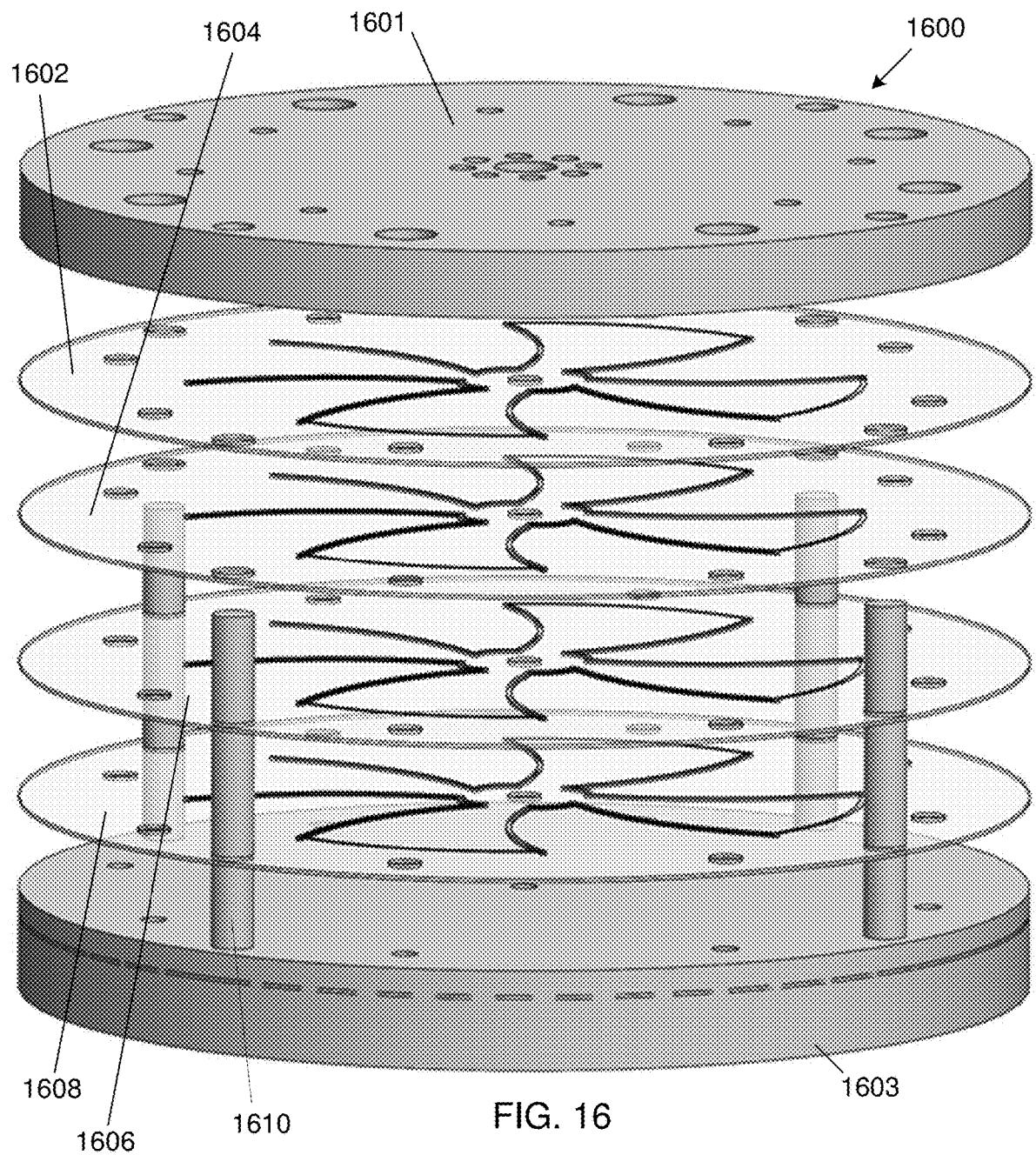
FIG. 16 is an exploded view of an exemplary embodiment of a microfluidic assembly with the sealing members and membrane system removed for purposes of illustration.

FIG. 16 shows an exemplary housing or microfluidic assembly 1600 (having first and second portions 1601 and 1603) which is similar to the housing 108 of microfluid assembly 100 except that microfluid assembly 1600 has a circular cross section and has four microchannel substrates 1602, 1604, 1606, and 1608. FIGS. 15 and 16 omit the membrane system and sealing members for purposes of illustration. In the illustrated embodiment, the microchannels etched on the substrates 1602-1608 are configured similarly to the microchannels in FIG. 25, but can be configured according to any of the microchannel embodiments described herein. Guide members 1610 can be coupled to the portion 1603 and can extend through the substrates to the portion 1601 in order to position the substrates in a selected orientation.

Figure 17A:
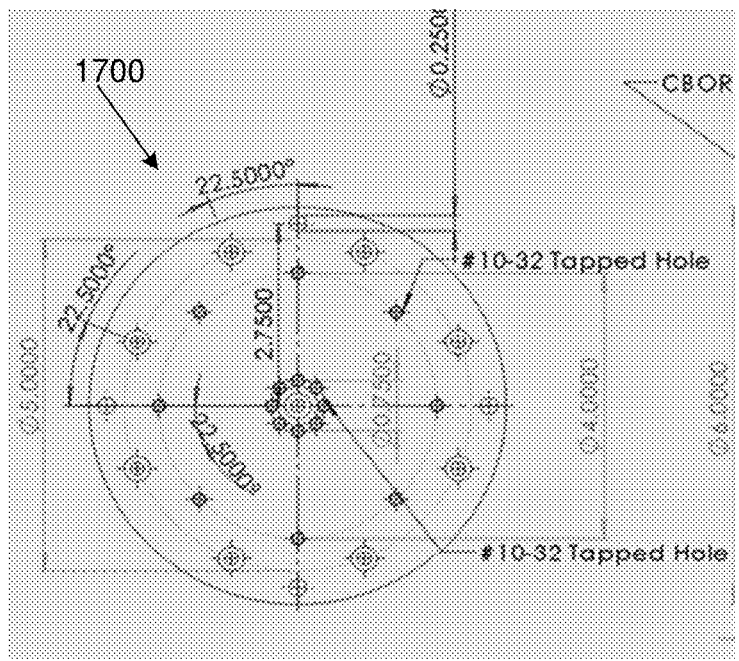
FIGS. 17A-17C illustrate various views of an exemplary first housing portion for a microfluidic assembly having a circular cross-section.
Figure 17B:
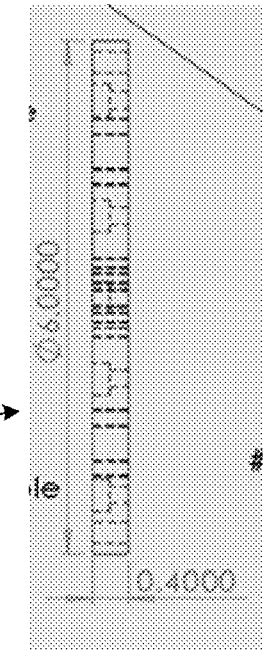
Figure 17C:
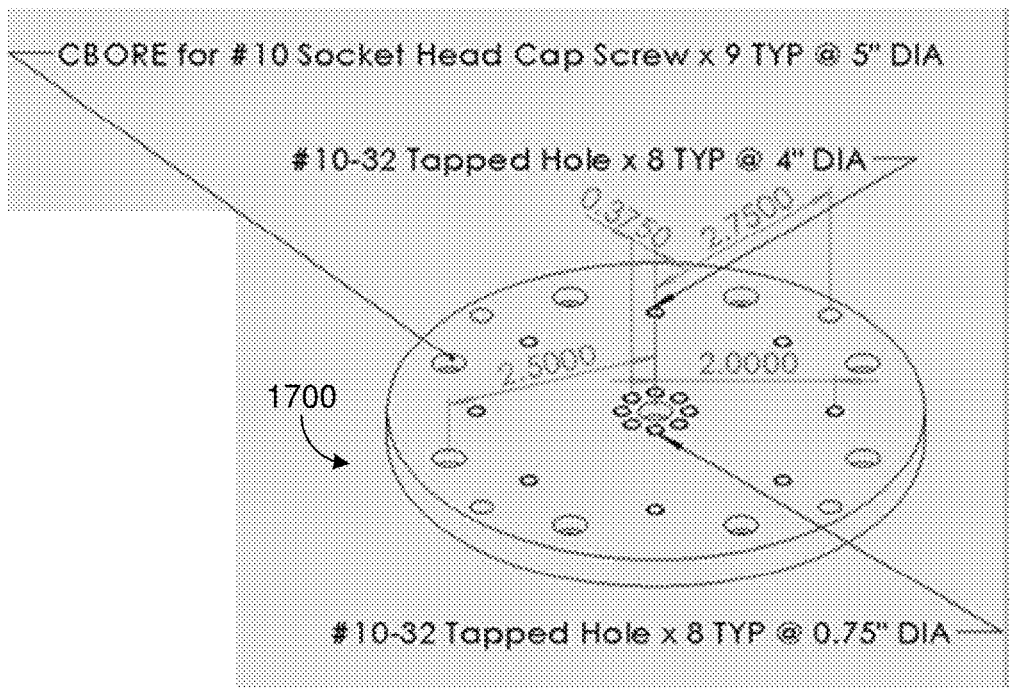
Figure 18A:
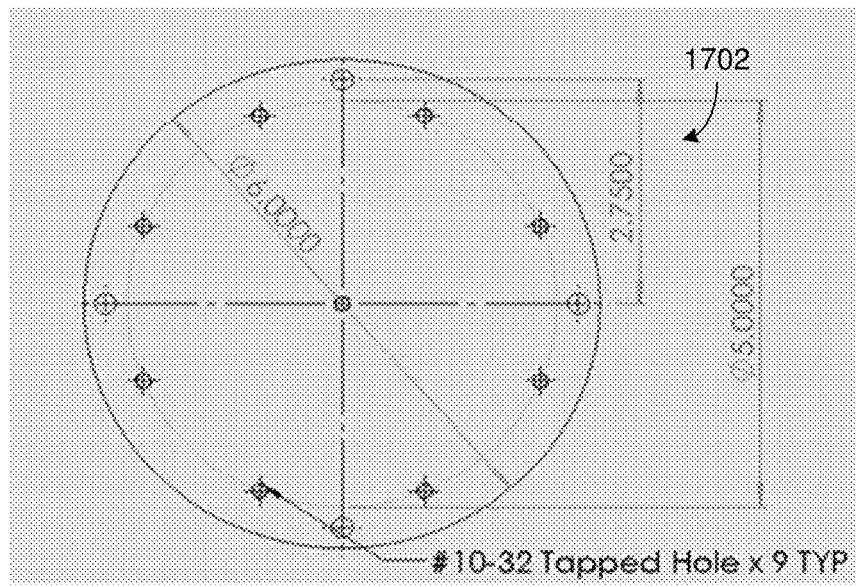
FIGS. 18A-18C illustrate various views of an exemplary second housing portion for a microfluid assembly having a circular cross-section.
Figure 18B:
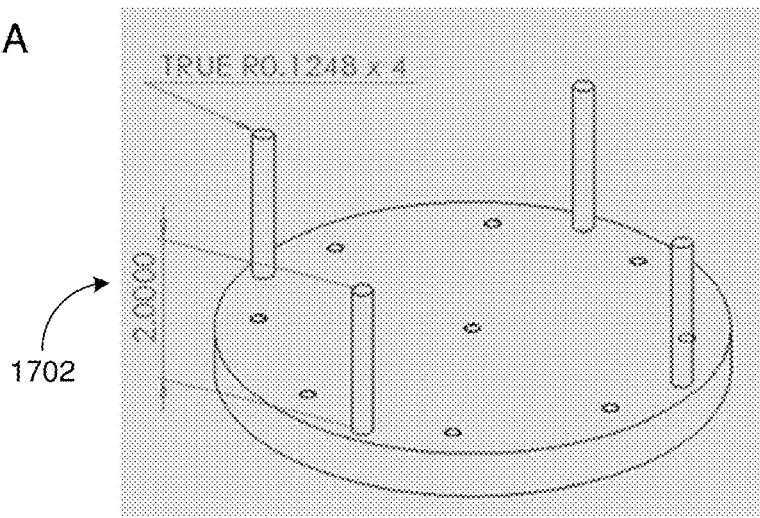
Figure 18C:
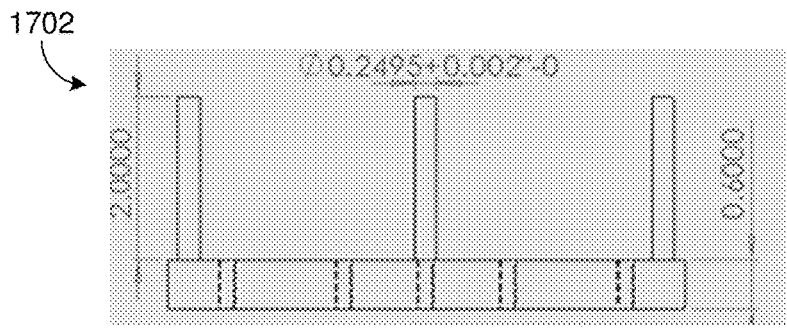

FIGS. 17A-17C show various views of an exemplary first housing portion 1700 for a microfluidic assembly having a circular cross-section, according to another embodiment. FIGS. 18A-18C show various views of an exemplary second housing portion 1702 useable with the first housing portion 1700 for a microfluid assembly having a circular cross-section, according to another embodiment. First and second housing portions 1700 and 1702 can be configured similarly to first and second housing portions 1601 and 1603 of microfluid assembly 1600. FIGS. 19A-19B show various views of an exemplary microchannel substrate 1704, useable with the first and second housing portions 1700 and 1702, and an exemplary microchannel design for a microfluid assembly having a circular cross-section, according to yet another embodiment. In a particular embodiment, flow can proceed through the microchannel substrate 1704 in the following exemplary manner. Fluid can enter a first end portion 1706 of a first radially extending channel 1708 and flow radially inward toward a center of the substrate 1704. The fluid can then flow through a circumferentially extending portion 1710 of the channel 1708 and out through a second end portion 1712 of the channel 1708. FIG. 25 shows a substrate useable with the assemblies shown in FIGS. 15-18C etched with an exemplary microchannel pattern.

Figure 20:
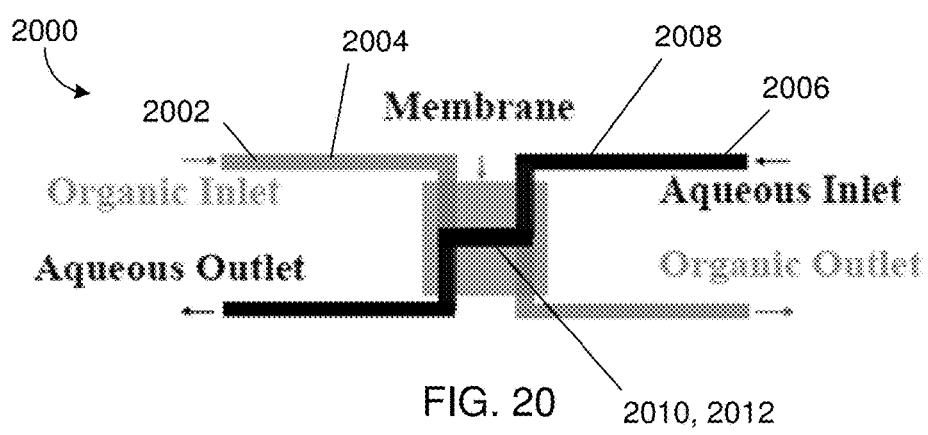
FIG. 20 schematically illustrates an exemplary embodiment of a microfluidic assembly configured for counter-current flow.

FIG. 20 illustrates a particular embodiment of a microfluidic assembly 2000 configured to provide an interface between, for example, an aqueous liquid and a non-aqueous liquid, such as an organic liquid. As used herein, an "organic liquid" refers to a liquid comprising one or more organic compounds that include one or more carbon atoms joined by covalent bonds, or mixtures or solutions thereof. Exemplary organic liquids include xylenes, toluenes, acetone, etc. The inlet 2002 of the first channel 2004 is located on the opposite side of the assembly from the inlet 2006 of the second channel 2008. The two liquids can flow on opposite surfaces of the graphene layer of the membrane assembly 2000 through the main portions 2010, 2012 of the channels 2004, 2008. In some embodiments, the system can be configured for counter-current flow (e.g., dual flow), in other embodiments, the system can be configured for co-current flow. As used herein "counter-current flow" means that a first liquid and a second liquid flow through the system in opposite directions relative to one another, and "co-current" flow means that the first and second liquids flow through the system in the same direction relative to one another. For example, in certain embodiments, in a counter-current flow system, the inlets of the microchannels on one side of the membrane are on the opposite end of the device from the inlets of the microchannels on the opposite side of the membrane.

In some embodiments, the disclosed microfluidic assemblies described herein can be used in multi-phase flow regimes such as two-phase flow regimes. For example, a gas phase and a liquid phase (e.g., of the same substance or of different substances) can be flowed through the microfluidic assembly in order to interact.

EXAMPLE 1

Figure 28:
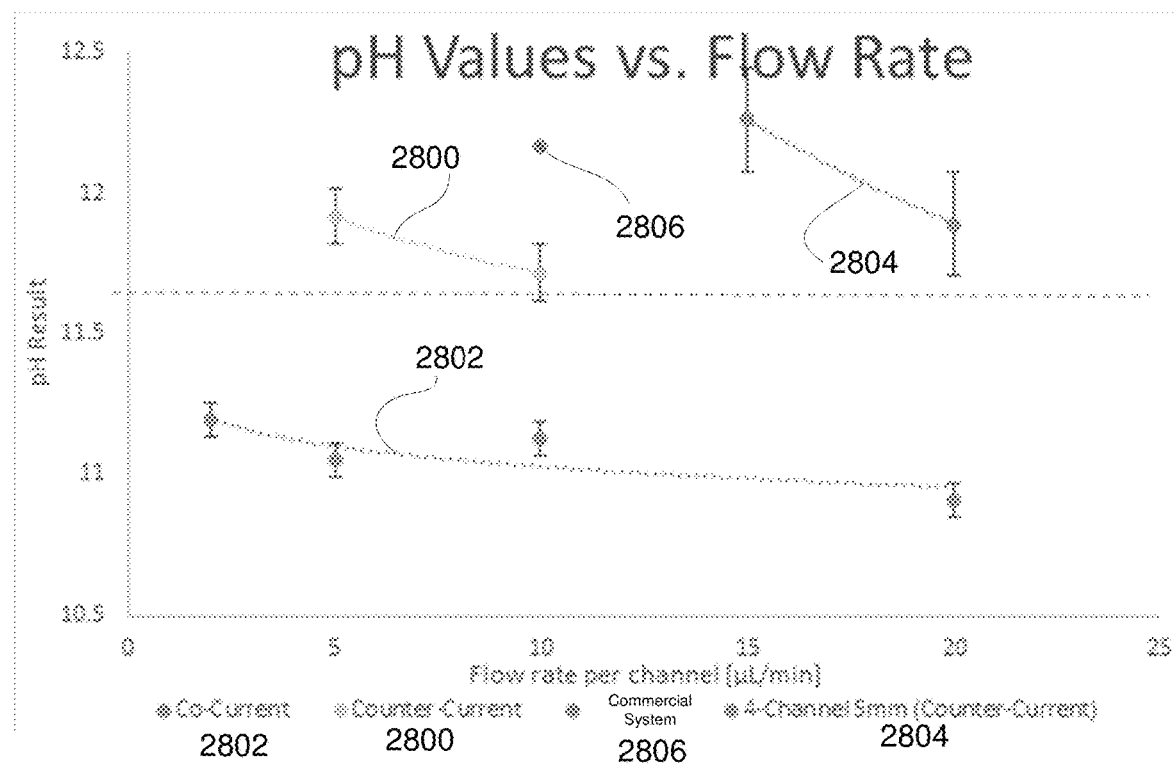
FIG. 28 is a graph of experimental results for pH values versus flow rate resulting from tests of various configurations of microfluidic assemblies described herein as compared to an existing microfluidic system.

The following example provides a representative method of testing a microfluidic assembly according to the embodiments described herein. FIG. 28 illustrates the results of the test in graph form.

Testing. A tested version of the microfluidic assembly had a mass transfer area (MTA) of 0.5 mm$^2$ and was tested using pH change as an indicator of ionic transfer across the membrane system. The pH of deionized (DI) water is in the neutral range (pH 7 to pH 8). In one representative embodiment, DI water was flowed through microchannels on one side of the graphene membrane, and an organic liquid (e.g., n-decane and triethylamine(TEA)) was flowed through the microchannels on the other side of the graphene membrane. As shown in FIG. 28, at a counter-current (2800) flow rate of 5 µL/min, the pH change of the DI water was approximately 4 (from pH 8 to approximately pH 12), and at a counter-current flow rate of 10 µL/min, the pH change was approximately 2.75 (from pH 8 to approximately pH 11.75). At a co-current (2802) flow rate of 5 µL/min, the pH change of the DI water was approximately 3 (from pH 8 to approximately pH 11). A pH change of approximately 3-4 (from pH 8 to approximately pH 12, and in some instances as much as pH 12.5) was shown in the test fluids, indicating that the membrane system functioned as a surprisingly effective membrane for mass transfer. In another test, DI water and an organic liquid (e.g., n-decane and triethylamine) were counter-currently flowed through a microfluidic system as described herein (2804) and including four channels on each side of the graphene membrane, the channels having a length of 5 mm. At a counter-current flow rate of 15 μL/min, the pH change of the DI water approximately 4.25, and at a counter-current flow rate of 20 μL/min, the pH change of the DI water approximately 3.75.

With the pH of deionized (DI) water in the neutral range (pH 7 to pH 8), and the equilibrium values of pH in the ternary phase system being 11.4, the microfluid assembly is effective as compared to a commercially available microfluidic system (2806) having a channel width of 250 μm, a channel length of 500 mm, and an MTA of 125 mm$^2$. The commercial system (2806) evaluated produced a pH change of about 4.25 at a counter-current flow rate 15 μL/min, and a pH change of about 4 at a counter-current flow rate of 20 μL/min. Thus, the microfluidic assemblies described herein achieved nearly the same performance as a commercially available microfluidic system with an MTA that was only 0.4% of the size of the commercially available system, as shown in FIG. 28.

Figure 29:
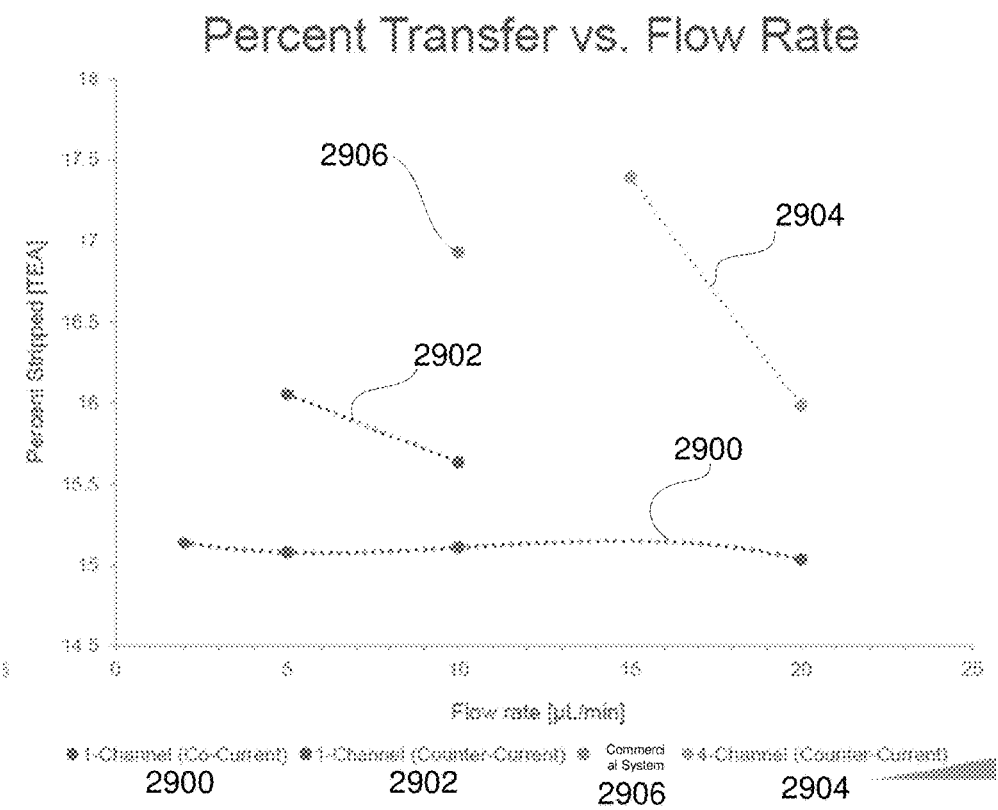
FIG. 29 is a graph of experimental results for percent transfer of triethylamine (TEA) versus flow rate resulting from a test of a microfluidic assembly.

FIG. 29 illustrates the amount of TEA stripped or transferred from the fluid stream for a selected flow rate. FIG. 29 illustrates the results for a 1-channel co-current system (2900), a 1-channel counter-current system (2902), a counter-current microfluidic system as described herein and including four channels on each side (2904), and a commercially available microfluidic system (2906).

The dimensions shown in the drawings are merely one example of the ways the concepts disclosed herein may be implemented, and should not be interpreted as limiting the scope of the disclosure.

GENERAL CONSIDERATIONS

For purposes of this description, certain aspects, advantages, and novel features of the embodiments of this disclosure are described herein. The disclosed methods, apparatus, and systems should not be construed as being limiting in any way. Instead, the present disclosure is directed toward all novel and nonobvious features and aspects of the various disclosed embodiments, alone and in various combinations and sub-combinations with one another. The methods, apparatus, and systems are not limited to any specific aspect or feature or combination thereof, nor do the disclosed embodiments require that any one or more specific advantages be present, or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "provide" or "achieve" to describe the disclosed methods. These terms are high-level abstractions of the actual operations that are performed. The actual operations that correspond to these terms may vary depending on the particular implementation and are readily discernible by one of ordinary skill in the art.

All features described herein are independent of one another and, except where structurally impossible, can be used in combination with any other feature described herein.

As used in this application and in the claims, the singular forms "a," "an," and "the" include the plural forms unless the context clearly dictates otherwise. Additionally, the term "includes" means "comprises." Further, the terms "coupled" and "associated" generally mean electrically, electromagnetically, and/or physically (e.g., mechanically or chemically) coupled or linked and does not exclude the presence of intermediate elements between the coupled or associated items absent specific contrary language.

In the following description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Unless otherwise indicated, all numbers expressing material quantities, angles, pressures, molecular weights, percentages, temperatures, times, and so forth, as used in the specification or claims are to be understood as being modified by the term "about." Accordingly, unless otherwise indicated, implicitly or explicitly, the numerical parameters set forth are approximations that can depend on the desired properties sought and/or limits of detection under test conditions/methods familiar to those of ordinary skill in the art. When directly and explicitly distinguishing embodiments from discussed prior art, the embodiment numbers are not approximates unless the word "about" is recited. Furthermore, not all alternatives recited herein are equivalents.

In view of the many possible embodiments to which the principles of the disclosed technology may be applied, it should be recognized that the illustrated embodiments are only examples and should not be taken as limiting the scope of the disclosure. Rather, the scope of the disclosure is as at least as broad as the following claims. We therefore claim all that comes within the scope of these claims.

The invention claimed is:

1. An assembly, comprising:
   a first microchannel substrate defining a first microchannel;
   a second microchannel substrate defining a second microchannel; and
   a membrane disposed between the first and second microchannel substrates, the membrane comprising a first polymeric layer, a second polymeric layer, and at least one graphene layer disposed between the first and second polymeric layers;
   wherein at least a portion of the first microchannel overlaps at least a portion of the second microchannel such that, when a first fluid is present in the first microchannel and a second fluid is present in the second microchannel, the first fluid and the second fluid contact opposite sides of the membrane.

2. The assembly of claim 1, further comprising a sealing member disposed between the membrane and at least one of the first microchannel substrate and the second microchannel substrate.

3. The assembly of claim 1, wherein the first and second microchannel substrates and the membrane are situated in a housing.

4. The assembly of claim 1, wherein the membrane comprises a plurality of graphene layers between the first and second polymeric layers.

5. The assembly of claim 1, wherein the at least one graphene layer comprises one or more functional groups.

6. The assembly of claim 5, wherein the functional groups are selected to modify at least one of: a surface area; a reactivity; a hydrophilicity; a surface energy; a magnetic property; a catalytic property; and a conductive property of the at least one graphene layer.

7. The assembly of claim 1, wherein the at least one graphene layer comprises pores extending through the graphene layer.

8. The assembly of claim 1, wherein the first and second microchannels each comprise an inlet portion, a main portion, and an outlet portion, and wherein the first and second microchannel substrates are disposed such that the main portions of the first and second microchannels overlap.

9. The assembly of claim 8, wherein the main portion of each microchannel branches into a plurality of additional microchannels.

10. The assembly of claim 1, wherein the membrane is configured to allow the transfer of particles across the membrane while preventing the first and second fluids from contacting one another.

11. The assembly of claim 1, wherein:
the first polymeric layer is permeable at least to the first fluid;
the second polymeric layer is permeable at least to the second fluid; and
the graphene layer is impermeable to the first fluid and impermeable to the second fluid.

12. The assembly of claim 11, wherein the first polymeric layer and the second polymeric layer comprise pores to allow fluid to flow through the first polymeric layer and the second polymeric layer and contact the graphene layer.

13. The assembly of claim 1, wherein the second microchannel is defined in a first surface of the second substrate, and wherein the second substrate defines a third microchannel in a second surface.

14. The assembly of claim 13, further comprising:
a third microchannel substrate defining a fourth microchannel; and
a second membrane disposed between the second surface of the second microchannel substrate and the third microchannel substrate;
wherein at least a portion of the third microchannel overlaps at least a portion of the fourth microchannel such that, when a third fluid is present in the third microchannel and a fourth fluid is present in the fourth microchannel, the third fluid and the fourth fluid contact opposite sides of the second membrane.

15. An assembly, comprising:
a housing having a first inlet, a second inlet, a first outlet, and a second outlet;
a first substrate comprising a first set of microchannels fluidly coupled at a first end to the first inlet and at a second end to the first outlet;
a second substrate comprising a second set of microchannels fluidly coupled at a first end to the second inlet and at a second end to the second outlet;
a membrane disposed between the first and second substrates, the membrane comprising one or more graphene layers and one or more polymeric layers;
wherein the one or more polymeric layers are permeable to a first fluid and permeable to a second fluid, and the graphene layer is impermeable to the first fluid and impermeable to the second fluid such that when the first fluid is present in the first set of microchannels and the second fluid is present in the second set of microchannels the first and second fluids can exchange mass or heat with one another across the membrane without directly contacting one another.

16. The assembly of claim 15, wherein the assembly has a circular cross-section.

17. A method, comprising:
flowing a first fluid through a first microchannel defined in a first microchannel substrate and along a first surface of a membrane, the membrane being disposed between the first microchannel substrate and a second microchannel substrate, the membrane comprising a first polymeric layer, a second polymeric layer, and at least one graphene layer disposed between the first and second polymeric layers;
flowing a second fluid through a second microchannel defined in the second microchannel substrate and along a second surface of the membrane such that the first and second fluids contact opposite sides of the membrane and can interact with one another across the membrane without directly contacting one another; and
wherein at least a portion of the first microchannel overlaps at least a portion of the second microchannel.

18. The method of claim 17, wherein the first fluid flows in a first direction, and the second fluid flows in a second direction counter-current to the first fluid.

19. The method of claim 17, wherein the first fluid and the second fluid flow co-currently in a first direction.

20. The method of claim 17, further comprising transferring a plurality of particles from the first fluid to the second fluid through the membrane.

* * * * *